(12) United States Patent
Tahara et al.

(10) Patent No.: US 8,986,493 B2
(45) Date of Patent: *Mar. 24, 2015

(54) ETCHING APPARATUS

(71) Applicant: Tokyo Electron Limited, Tokyo (JP)

(72) Inventors: Shigeru Tahara, Nirasaki (JP); Masaru Nishino, Beverly, MA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/717,812

(22) Filed: Dec. 18, 2012

(65) Prior Publication Data

US 2013/0118688 A1    May 16, 2013

Related U.S. Application Data

(60) Continuation of application No. 13/415,566, filed on Mar. 8, 2012, now Pat. No. 8,361,275, which is a continuation of application No. 12/690,802, filed on Jan. 20, 2010, now abandoned, which is a division of (Continued)

(30) Foreign Application Priority Data

Mar. 25, 2005 (JP) ................................ 2005-087889

(51) Int. Cl.
*H01L 21/3065* (2006.01)
*H01L 21/306* (2006.01)
(Continued)

(52) U.S. Cl.
CPC ..... *H01L 21/30604* (2013.01); *H01J 37/32935* (2013.01); *H01L 21/31116* (2013.01); *H01L 21/31138* (2013.01)
USPC ............ 156/345.26; 156/345.33; 156/345.34; 118/715; 216/37; 216/72; 216/74; 216/79

(58) Field of Classification Search
CPC ................... C23C 16/45565; C23C 16/45574; H01J 37/32449; H01J 37/3244; H01J 37/32935; H01L 21/30604; H01L 21/31138; H01L 21/31116
USPC ........... 156/345.33, 345.34, 345.26; 118/715; 216/37, 72, 74, 79
See application file for complete search history.

(56) References Cited

U.S. PATENT DOCUMENTS 5,770,098 A    6/1998 Araki et al.
5,811,357 A    9/1998 Armacost et al.
(Continued)

FOREIGN PATENT DOCUMENTS

JP    2002-184764 A    6/2002
JP    2004-193565    *    7/2004
(Continued)

*Primary Examiner* — Jeffrie R Lund
*Assistant Examiner* — Satish Chandra
(74) *Attorney, Agent, or Firm* — Rothwell, Figg, Ernst & Manbeck, P.C.

(57) ABSTRACT

When a substrate is etched by using a processing gas including a first gas containing halogen and carbon and having a carbon number of two or less per molecule, while supplying the processing gas toward the substrate independently from a central and a peripheral portion of a gas supply unit, which face the central and the periphery part of the substrate respectively, the processing gas is supplied such that a gas flow rate is greater in the central portion than in the peripheral portion. When the substrate is etched by using a processing gas including a second gas containing halogen and carbon and having a carbon number of three or more per molecule, the processing gas is supplied such that a gas flow rate is greater in the peripheral portion than in the central portion.

10 Claims, 13 Drawing Sheets

Related U.S. Application Data application No. 11/389,041, filed on Mar. 27, 2006, now Pat. No. 7,674,393.

(60) Provisional application No. 60/666,574, filed on Mar. 31, 2005.

(51) Int. Cl.
*H01J 37/32* (2006.01)
*H01L 21/311* (2006.01)

(56) References Cited

U.S. PATENT DOCUMENTS

| | | | |
|---|---|---|---|
| 5,888,907 A | 3/1999 | Tomoyasu et al. | |
| 6,238,588 B1 * | 5/2001 | Collins et al. | 216/68 |
| 6,245,192 B1 | 6/2001 | Dhindsa et al. | |
| 6,333,272 B1 | 12/2001 | McMillin et al. | |
| 6,415,736 B1 | 7/2002 | Hao et al. | |
| 6,432,831 B2 | 8/2002 | Dhindsa et al. | |
| 6,508,913 B2 * | 1/2003 | McMillin et al. | 156/345.29 |
| 6,589,437 B1 | 7/2003 | Collins | |
| 6,799,603 B1 * | 10/2004 | Moore | 137/597 |
| 7,674,393 B2 | 3/2010 | Tahara et al. | |
| 7,740,737 B2 | 6/2010 | Koshiishi et al. | |
| 2002/0096259 A1 | 7/2002 | Collins et al. | |
| 2003/0094903 A1 * | 5/2003 | Tao et al. | 315/111.91 |
| 2004/0031565 A1 | 2/2004 | Su et al. | |
| 2004/0163764 A1 | 8/2004 | Collins et al. | |
| 2005/0061243 A1 * | 3/2005 | Sarigiannis et al. | 118/715 |
| 2005/0257743 A1 * | 11/2005 | Koshiishi et al. | 118/723 E |
| 2005/0269292 A1 | 12/2005 | Koshiishi et al. | |
| 2006/0000803 A1 | 1/2006 | Koshiishi et al. | |
| 2006/0021580 A1 | 2/2006 | Hirano | |
| 2006/0037701 A1 | 2/2006 | Koshiishi et al. | |
| 2006/0042754 A1 | 3/2006 | Yoshida et al. | |
| 2006/0066247 A1 | 3/2006 | Koshiishi et al. | |
| 2006/0213864 A1 | 9/2006 | Tahara et al. | |
| 2009/0223926 A1 | 9/2009 | Hirano | |
| 2010/0116786 A1 | 5/2010 | Tahara et al. | |
| 2010/0116787 A1 | 5/2010 | Tahara et al. | |
| 2010/0126668 A1 | 5/2010 | Koshiishi et al. | |
| 2010/0133234 A1 | 6/2010 | Yoshida et al. | |

FOREIGN PATENT DOCUMENTS

| | | |
|---|---|---|
| JP | 2004-193567 A | 7/2004 |
| KR | 1994-0022725 A | 10/1994 |
| KR | 10-0385532 B1 | 8/2003 |

\* cited by examiner

| GAS FLOW RATE RATIO C/E | | RESIDUAL RESIST FILM (nm) | ETCHING DEPTH (nm) | TOP CD (nm) | BOWING POSITION (nm) |
|---|---|---|---|---|---|
| 1/9 | CENTER | 552 | 1094 | 292 | 770 |
| | PERIPHERY | 406 | 1021 | 333 | 385 |
| | DIFFERENCE | 146 | 73 | 41 | 385 |
| 5/5 | CENTER | 469 | 1072 | 312 | 625 |
| | PERIPHERY | 417 | 1042 | 323 | 438 |
| | DIFFERENCE | 52 | 30 | 11 | 187 |
| 9/1 | CENTER | 448 | 979 | 312 | 448 |
| | PERIPHERY | 406 | 990 | 323 | 438 |
| | DIFFERENCE | 42 | 11 | 11 | 10 |

FIG.10

| GAS FLOW RATE RATIO C/E | | RESIDUAL RESIST FILM (nm) | TOP CD (nm) | BOTTOM CD (nm) | RECESS (nm) |
|---|---|---|---|---|---|
| 1/9 | CENTER | 257 | 105 | 90 | 61 |
| | PERIPHERY | 203 | 117 | 117 | 117 |
| | DIFFERENCE | 54 | 12 | 27 | 56 |
| 5/5 | CENTER | 249 | 121 | 109 | 67 |
| | PERIPHERY | 211 | 130 | 118 | 81 |
| | DIFFERENCE | 38 | 9 | 9 | 14 |
| 9/1 | CENTER | 232 | 125 | 109 | 77 |
| | PERIPHERY | 213 | 120 | 113 | 86 |
| | DIFFERENCE | 9 | 5 | 4 | 9 |

| C/E RATIO | CD (nm) | CENTER | PERIPHERY | DIFFERENCE |
|---|---|---|---|---|
| 5 : 5 | TOP CD (nm) | 141 | 151 | 10 |
|  | BOTTOM CD (nm) | 111 | 128 | 17 |
| 9 : 1 ↕ 1 : 9 | TOP CD (nm) | 146 | 150 | 4 |
|  | BOTTOM CD (nm) | 118 | 128 | 10 |

| GAS FLOW RATE (sccm) | | ETCHING RATE (nm/min) | RESIST SELECTIVITY | RESIDUAL RESIST FILM (nm) | DEPTH UNIFORMITY (%) |
|---|---|---|---|---|---|
| C=208 E=312 | CENTER | 534 | 5.3 | 345 | ± 3.2 |
| | PERIPHERY | 501 | 5.6 | 380 | |
| | DIFFERENCE | 23 | 0.3 | 35 | |
| C=208 E=208 | CENTER | 534 | 5.3 | 345 | ± 6.3 |
| | PERIPHERY | 471 | 5.9 | 410 | |
| | DIFFERENCE | 63 | 0.6 | 65 | |

| GAS FLOW RATE RATIO C/E | ETCHING RATE (nm/min) | | |
|---|---|---|---|
| | CENTER | PERIPHERY | DIFFERENCE |
| 50 : 50 | 878 | 826 | 52 |
| 95 : 5 | 834 | 848 | 12 |

ETCHING APPARATUS

CROSS-REFERENCE TO RELATED APPLICATIONS

This application claims the benefit of priority of each of the following applications and describes the relationship of the earlier applications. The present application is a Continuation Application of and claims the benefit of priority from co-pending U.S. application Ser. No. 13/415,566, filed Mar. 8, 2012, which is a Continuation Application of U.S. application Ser. No. 12/690,802, filed on Jan. 20, 2010, which is a Divisional application of U.S. application Ser. No. 11/389,041, which is now U.S. Pat. No. 7,674,393, patented on Mar. 9, 2010, which claims the benefit of priority from U.S. Provisional Application No. 60/666,574, filed on Mar. 31, 2005 and is further based upon and claims the benefit of priority from the prior Japanese Patent Application No. 2005-087889, filed on Mar. 25, 2005. The entire contents of foregoing applications are incorporated herein by reference.

FIELD OF THE INVENTION

The present invention relates to a technology for performing an etching on an etching target film formed on a substrate such as a semiconductor wafer by using a gas containing carbon and halogen.

BACKGROUND OF THE INVENTION

In a manufacturing process of a semiconductor device or an LCD substrate, an etching process is performed to form a pattern of a thin film. As one of a variety of etching apparatuses, for example, there is a parallel plate plasma etching apparatus, wherein parallel plate electrodes including a pair of an upper and a lower electrode are disposed in a chamber, and a high frequency electric field is formed therebetween by applying a high frequency power to either one of the electrodes while introducing a processing gas into the chamber. Due to the high frequency electric field, a plasma of the processing gas is generated, whereby an etching process is performed on, e.g., a semiconductor wafer (hereinafter, referred to as a "wafer") W.

For example, in the semiconductor device, a low dielectric film (low-k film) is practically used or tested as an interlayer insulating film, a gate insulating film or the like. As the low dielectric film including silicon (Si) and oxygen (O), for example, there are an SiOC film formed by adding carbon to an SiO film serving as a base film and an SiOCH film formed by adding carbon and hydrogen onto the SiO film. When etching those films, a gas containing carbon (C) and halogen such as fluorine (F), chlorine (Cl) and bromine (Br) is used as a processing gas.

In etching, a hole (recess) is formed by an etching action of an etchant together with polymerization which forms polymer on a sidewall of the hole to protect the sidewall. For example, when the SiO-based film is etched by using a gas containing carbon and fluorine (hereinafter, referred to as a "CF-based gas") as a processing gas, active species of CF, which are produced when the CF-based gas is converted into a plasma, cause both the etching and the polymerization.

The CF-based gases such as $CF_4$ gas, $CHF_3$ gas, $C_2F_6$ gas, $C_3F_8$ gas, $C_4F_8$ gas, $C_4F_6$ gas, and $C_5F_8$ gas have different etching action and polymerization. Therefore, although etching target films are the same, the most suitable kind of gas is selected from the CF-based gases depending on a film thickness ratio of the etching target film to an underlying film or a resist film.

Further, in the conventional parallel plate plasma etching apparatus, in order to improve uniformity of etching characteristics (e.g., an etching rate and processing dimensions after etching) on the surface of the wafer W, the processing gas is supplied toward the wafer W from the upper electrode configured as a shower head having a plurality of gas injection openings, for instance, while varying gas flow rates supplied onto a center part and a periphery part of the wafer W.

However, due to lack of a consistent and reliable method for determining a flow rate ratio of gases supplied to the central and the periphery part for respective CF-based gases, the flow rate ratio is determined through many trials and errors to perform an etching process with a high in-surface uniformity. Thus, a lot of efforts and time are necessary to determine the flow rate ratio.

Japanese Patent Laid-open Application No. 2002-184764 discloses a technology wherein when an etching process is performed on TEOS and a resist by using a gaseous mixture including $C_5F_8$ gas, gaseous mixtures having different flow rate ratios are supplied from two gas injection openings of the shower head which are concentrically formed such that an oxygen flow rate is lower in the periphery part, thereby preventing an etching selectivity (TEOS/resist) in the periphery part from being deteriorated. Even in the aforementioned patent document, however, there is not disclosed a consistent and reliable method for determining a flow rate ratio of gases supplied to the central and the periphery part of the wafer W when an etching is performed by using the CF-based gas.

SUMMARY OF THE INVENTION

The present invention has been conceived from the above problems; and it is, therefore, an object of the present invention to provide a technology capable of improving in-surface uniformity when an etching is performed on a substrate by using gas containing carbon and halogen.

In accordance with one embodiment of the present invention, there is provided an etching method of performing etching on an etching target film of a substrate by using a processing gas including a first gas containing halogen and carbon and having a carbon number of two or less per molecule, and a gas supply unit for supplying the processing gas toward the substrate from a central portion and a peripheral portion of the gas supply unit, independently, the central and the peripheral portion respectively facing the central and the periphery part of the substrate, the method including the step of performing etching on the etching target film of the substrate while supplying the processing gas from the gas supply unit such that a flow rate of the first gas per unit area of a gas supply surface of the gas supply unit is greater in the central portion than in the peripheral portion.

Further, in accordance with another embodiment of the present invention, there is provided an etching method of performing etching on an etching target film of a substrate by using a processing gas including a second gas containing halogen and carbon and having a carbon number of three or more per molecule, and a gas supply unit for supplying the processing gas toward the substrate from a central portion and a peripheral portion of the gas supply unit, independently, the central and the peripheral portion respectively facing the central and the periphery part of the substrate, the method including the step of performing etching on the etching target film of the substrate while supplying the processing gas from the gas supply unit such that a flow rate of the second gas per unit area of a gas supply surface of the gas supply unit is greater in the peripheral portion than in the central portion.

Further, in accordance with still another embodiment of the present invention, there is provided an etching method of performing etching on an etching target film of a substrate by using a processing gas which is a gaseous mixture including a first gas containing halogen and carbon and having a carbon number of two or less per molecule and a second gas containing halogen and carbon and having a carbon number of three or more per molecule, and a gas supply unit for supplying the processing gas toward the substrate from a central portion and a peripheral portion of the gas supply unit, independently, the central and the peripheral portion respectively facing the central and the periphery part of the substrate, the method including the step of performing etching on the etching target film of the substrate while supplying the processing gas from the gas supply unit, wherein a mixing ratio of the first gas to the second gas in the central portion is equal to that in the peripheral portion; and if a total number of halogen atoms supplied along with the first gas is greater than that of halogen atoms supplied along with the second gas, the processing gas is supplied such that a flow rate of the gaseous mixture per unit area of a gas supply surface of the gas supply unit is greater in the central portion than in the peripheral portion, and if the total number of halogen atoms supplied along with the first gas is smaller than that of halogen atoms supplied along with the second gas, the processing gas is supplied such that a flow rate of the gaseous mixture per unit area of a gas supply surface of the gas supply unit is greater in the peripheral portion than in the central portion. In the etching method, the step of supplying the processing gas from the gas supply unit such that a supply amount of the gaseous mixture including the first gas and the second gas is greater or smaller in the central portion than in the peripheral portion is performed by controlling at least one of a flow rate of the processing gas and a dilution rate of the processing gas diluted with the dilution gas.

Further, in accordance with still another embodiment of the present invention, there is provided an etching method of performing etching on an etching target film of a substrate by using a processing gas which is a gaseous mixture including a first gas containing halogen and carbon and having a carbon number of two or less per molecule and a second gas containing halogen and carbon and having a carbon number of three or more per molecule, and a gas supply unit for supplying the processing gas toward the substrate from a central portion and a peripheral portion of the gas supply unit, independently, the central and the peripheral portion respectively facing the central and the periphery part of the substrate, the method including the step of performing etching on the etching target film of the substrate while supplying the processing gas from the gas supply unit, wherein a first processing gas produced by mixing the first gas with the second gas at a first mixing ratio is supplied to the central portion of the gas supply unit, and a second processing gas produced by mixing the first gas with the second gas at a second mixing ratio is supplied to the peripheral portion of the gas supply unit; and if a total number of halogen atoms supplied along with the first gas is greater than that of halogen atoms supplied along with the second gas, the processing gas is supplied such that a flow rate of the first processing gas is greater than that of the second processing gas per unit area of the gas supply surface of the gas supply unit, and if the total number of halogen atoms supplied along with the first gas is smaller than that of halogen atoms supplied along with the second gas, the processing gas is supplied such that a flow rate of the first processing gas is smaller than that of the second processing gas per unit area of the gas supply surface of the gas supply unit.

Further, in accordance with still another embodiment of the present invention, there is provided an etching method of performing etching on an etching target film of a substrate by using a processing gas which is a gaseous mixture including a first gas containing halogen and carbon and having a carbon number of two or less per molecule and a second gas containing halogen and carbon and having a carbon number of three or more per molecule, and a gas supply unit for supplying the processing gas toward the substrate from a central portion and a peripheral portion of the gas supply unit, independently, the central and the peripheral portion respectively facing the central and the periphery part of the substrate, the method including the step of performing etching on the etching target film of the substrate while supplying the processing gas from the gas supply unit such that a flow rate of the first gas per unit area of the gas supply surface of the gas supply unit is greater in the central portion than in the peripheral portion and a flow rate of the second gas per unit area of the gas supply surface of the gas supply unit is greater in the peripheral portion than in the central portion.

Further, in accordance with still another embodiment of the present invention, there is provided an etching method of performing etching on an etching target film of a substrate by using a processing gas which is a gaseous mixture including a first gas containing halogen and carbon and having a carbon number of two or less per molecule and a second gas containing halogen and carbon and having a carbon number of three or more per molecule, and a gas supply unit for supplying the processing gas toward the substrate from a central portion and a peripheral portion of the gas supply unit, independently, the central and the peripheral portion respectively facing the central and the periphery part of the substrate, the method including the step of performing etching on the etching target film of the substrate while supplying the processing gas from the gas supply unit wherein if a supply amount of the first gas in the central portion of the gas supply unit is equal to that in the peripheral portion thereof, the processing gas is supplied such that a flow rate of the second gas per unit area of the gas supply surface of the gas supply unit is greater in the peripheral portion than in the central portion, and if a supply amount of the second gas in the central portion of the gas supply unit is equal to that in the peripheral portion thereof, the processing gas is supplied such that a flow rate of the first gas per unit area of the gas supply surface of the gas supply unit is greater in the central portion than in the peripheral portion.

In the etching method, the step of supplying the processing gas from the gas supply unit such that a supply amount of the first gas is greater in the central portion than in the peripheral portion is performed by controlling at least one of a flow rate of the first gas and a dilution rate of the first gas diluted with the dilution gas. Further, the step of supplying the processing gas from the gas supply unit such that a supply amount of the second gas is greater in the peripheral portion than in the central portion is performed by controlling at least one of a flow rate of the second gas and a dilution rate of the second gas diluted with the dilution gas.

Further, in accordance with still another embodiment of the present invention, there is provided an etching method of performing etching on an etching target film of a substrate by using a processing gas which is a gaseous mixture including a first gas containing halogen and carbon and having a carbon number of two or less per molecule and a second gas containing halogen and carbon and having a carbon number of three or more per molecule, and a gas supply unit for supplying the processing gas toward the substrate from a central portion and a peripheral portion of the gas supply unit, independently, the central and the peripheral portion respectively facing the central and the periphery part of the substrate, the method including the step of setting a composition and an amount of the processing gas supplied from the gas supply unit, wherein if a total number of halogen atoms supplied along with the first gas is greater than that of halogen atoms supplied along with the second gas, the processing gas is set such that a total number of halogen atoms per unit area of the gas supply surface of the gas supply unit per unit time is greater in the central portion than in the peripheral portion, and if the total number of halogen atoms supplied along with the first gas is smaller than that of halogen atoms supplied along with the second gas, the processing gas is supplied such that the total number of halogen atoms per unit area of the gas supply surface of the gas supply unit per unit time is greater in the peripheral portion than in the central portion.

In the etching method, at least one of $CH_2F_2$ gas, $CHF_3$ gas, $CF_4$ gas and $C_2F_6$ gas may be used as the first gas, and at least one of $C_3F_8$ gas, $C_4F_8$ gas, $C_4F_6$ gas and $C_5F_8$ gas may be used as the second gas.

Such an etching method is performed by an etching apparatus, including a processing chamber in which a susceptor for mounting a substrate thereon is disposed; a gas supply unit, disposed in the processing chamber to face the susceptor and having a surface facing the susceptor serving as a gas supply surface, for supplying a processing gas containing carbon and halogen toward the substrate mounted on the susceptor from a central portion and a peripheral portion of the gas supply unit, independently, the central and the peripheral portion respectively facing the central and the periphery part of the substrate; a means for controlling a pressure inside the processing chamber; a means for generating a plasma in the processing chamber; a means for controlling a flow rate of the processing gas supplied to the gas supply unit; and a controller for controlling each of the means, wherein an etching target film formed on the substrate is etched by a plasma of the processing gas.

As described above, in accordance with the present invention, when etching is performed on an etching target film formed on a substrate by using a processing gas including a gas containing carbon and halogen, a supply amount of the gas containing carbon and halogen is controlled, according to the carbon number of the gas containing carbon and halogen, in such a manner that a greater flow rate is supplied to the central portion of the gas supply surface than to the peripheral portion and vice versa. Therefore, high in-surface uniformity of etching characteristics such as an etching rate, processing accuracy after etching can be achieved.

BRIEF DESCRIPTION OF THE DRAWINGS

The above and other objects and features of the present invention will become apparent from the following description of preferred embodiments given in conjunction with the accompanying drawings, in which:

FIG. 10 shows in-surface uniformity of a residual resist film, a top CD, a bottom CD and a recess in Embodiment 4;

DETAILED DESCRIPTION OF THE PREFERRED EMBODIMENTS

Figure 1:
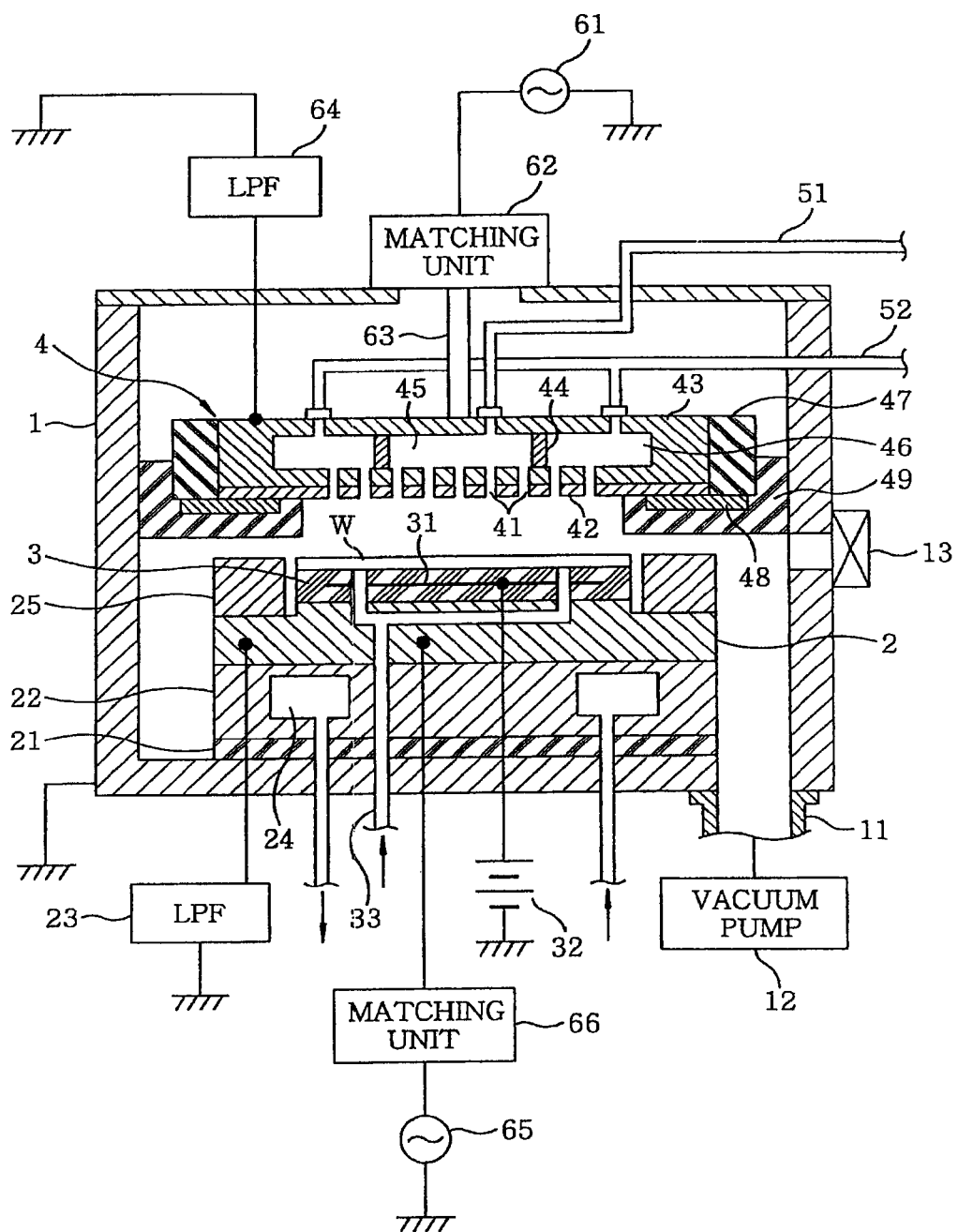
FIG. 1 is a vertical sectional view showing a plasma etching apparatus in accordance with a preferred embodiment of the present invention.

Above all, there will be briefly described an example of a plasma etching apparatus for performing an etching method in accordance with a first preferred embodiment of the present invention with reference to FIG. 1. FIG. 1 shows a chamber 1 which is, for example, a cylindrical processing vessel formed of, e.g., aluminum whose surface is alumite treated (anodic oxidized); and the chamber 1 is grounded. Provided in a bottom portion of the chamber 1 is an approximately cylindrical susceptor 2 for mounting thereon a substrate such as a semiconductor wafer (hereinafter, referred to as a "wafer"). Further, the susceptor 2 also serves as a lower electrode and is connected to a high pass filter (HPF) 23. Reference numerals 21 and 22 in FIG. 1 refer to an insulating plate made of ceramic or the like and a susceptor support member, respectively. A reference numeral 24 in FIG. 1 refer to a coolant chamber to which a coolant such as liquid nitrogen is supplied to be circulated therein, so that the susceptor 2 can be maintained at a desired temperature by heat conduction.

The susceptor 2 has an upper central portion of disk shape, which protrudes higher than its peripheral portion, and an electrostatic chuck 3 that is shaped substantially identical to the wafer W is disposed on the upper central portion of the susceptor 2. Further, the electrostatic chuck 3 includes an electrode 31 therein. The wafer W is electrostatically adsorbed onto electrostatic chuck 3 by Coulomb force generated by a DC voltage of, for example, 1.5 kV applied to the electrode 31 from a DC power supply 32. A reference numeral 33 in FIG. 1 refer to a gas channel for supplying a heat transfer medium, e.g., a He gas, to a backside surface of the wafer W supported on the susceptor 2, wherein heat is transferred between the susceptor 2 and the wafer W through the heat transfer medium, so that the wafer W can be maintained at a predetermined temperature. A reference numeral 25 in FIG. 1 refer to an annular focus ring disposed to surround the wafer W loaded on the electrostatic chuck 3. The focus ring 25 is formed of an electrically conductive material such as silicon and functions to improve uniformity of etching.

A gas supply unit 4 also serving as an upper electrode of, e.g., an approximately cylindrical shape is disposed above the susceptor 2 to face it in parallel. The gas supply unit 4 includes an electrode plate 42 forming a facing surface to the susceptor 2 and having a plurality of injection openings 41; and an electrode support member 43 for supporting the electrode plate 42. Further, the electrode support member 43 has a water cooling structure and is formed of, for example, aluminum whose surface is alumite treated.

The electrode support member 43 includes a gas introduction chamber formed therein, which is divided into two inner and outer parts which are, respectively, a first gas chamber (first gas introduction chamber) 45 facing a center part of the wafer W and a second gas chamber (second gas introduction chamber) 46 facing a periphery part of the wafer W by a partition wall 44 of, e.g., a ring shape. Thus, bottom surfaces of the first gas chamber 45 and the second gas chamber 46 are formed with the electrode plate 42 having the injection openings 41 and serving as a gas supply surface.

Figure 2:
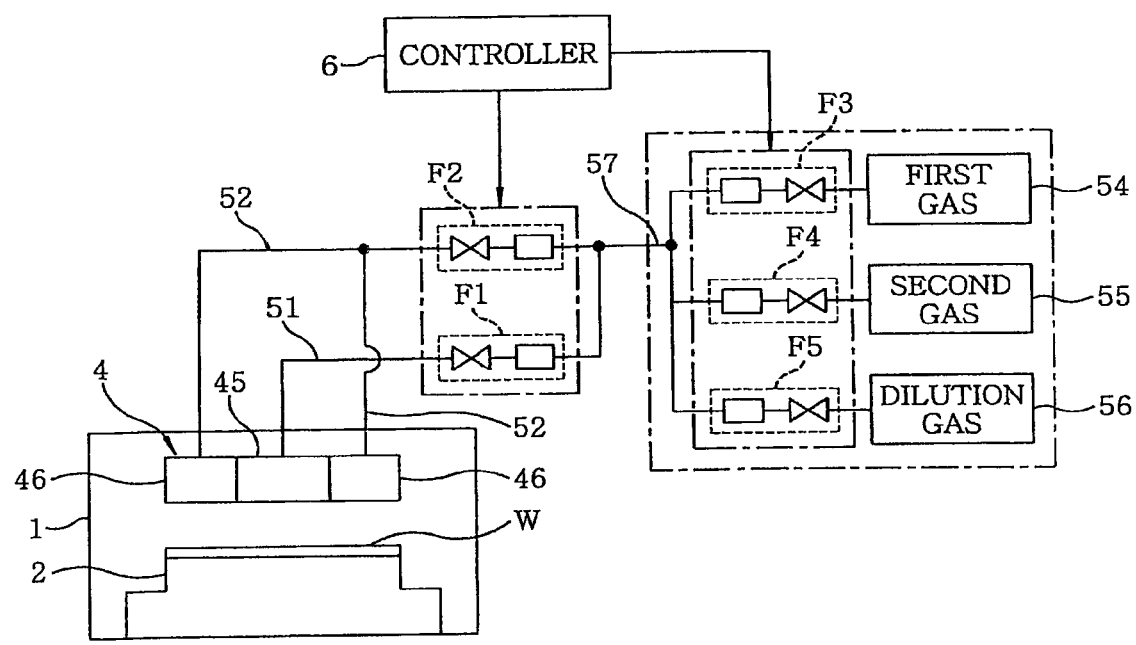
FIG. 2 shows a configuration of a gas supply system of the plasma etching apparatus.

Further, for instance, as shown in FIG. 2, the first gas chamber 45 is connected to a processing gas supply system 53 via a first gas introduction line 51 provided with a flow rate control unit F1; and the second gas chamber 46 is connected to the processing gas supply system 53 via a second gas introduction line 52 provided with a flow rate control unit F2. A reference numeral 47 in FIG. 1 refer to an insulation member; reference numeral 48, a high frequency absorbing member; and reference numeral 49, an insulation member for supporting the gas supply unit 4 in the chamber 1. Further, the susceptor 2 and the gas supply unit 4 are spaced from each other by, for example, about 10~60 mm.

A low dielectric film (low-k film) described above such as an SiOC film, an SiOCH film, an $SiO_2$ film, an SiOF film, an $SiO_2$ film containing Si—H, a HydrogenSilses-Quioxane (HSQ) film, a porous silica film, a $SiO_2$ film containing a methyl group, a MethylSilses-Quioxane (MSQ) film, a porous MSQ film or the like can be used as an etching object film. As for the processing gas, a gas containing carbon and a halogen atom such as fluorine, bromine and chlorine is used as a main etching gas. As examples of a CF-based gas containing carbon and fluorine employed as a main etching gas, there are a first gas having a carbon number of 2 or less (e.g., $CF_4$ gas, $CHF_3$ gas, and $C_2H_6$ gas), and a second gas having a carbon number of 3 or more (e.g., $C_3F_8$ gas, $C_4F_6$ gas, $C_4F_8$ gas, and $C_5F_8$ gas). Moreover, as the processing gas, it is possible to use a gaseous mixture obtained by mixing the CF-based gas with a rare gas or a dilution gas such as, $N_2$ gas, $H_2$ gas, $O_2$ gas, CO gas and $CO_2$ gas without containing halogen atom, or a combination of a plurality of the CF-based gases.

The processing gas supply system 53, for example, includes a first gas supply source 54 for supplying the first gas, a second gas supply source 55 for supplying the second gas and a dilution gas supply source 56 for supplying the dilution gas, which are connected to the first gas introduction line 51 and the second gas introduction line 52 via a supply line 57 equipped with respective flow rate control units F3 to F5. The flow rate control units F1 to F5 for regulating a supply amount of the processing gas include a valve and a mass flow controller, and their operations are controlled by a controller 6. Thus, the first gas, the second gas and the dilution gas are mixed to make the processing gas, and the mixed processing gas is supplied to the first gas introduction chamber 45 and the second gas introduction chamber 46 at specified flow rates, respectively.

A vacuum pump 12 such as a turbo molecular pump for controlling the pressure in the chamber 1 is connected to a bottom portion of the chamber 1 via a gas exhaust pipe 11. Thus, the inside of the chamber 1 can be evacuated to form therein a depressurized atmosphere having, e.g., a predetermined pressure of 1 Pa or less. Further, a gate valve 13 is installed on a sidewall of the chamber 1. The wafer W is transferred between the chamber 1 and an adjacent load-lock chamber (not shown) while the gate valve 13 is opened.

The gas supply unit 4 serving as the upper electrode is connected to a first high frequency power supply 61 serving as a plasma generation means through a matching unit 62 and a power feed rod 63, and, further, coupled to a low pass filter (LPF) 64. The first high frequency power supply 61 has a frequency of 27 MHz or more. By applying a high frequency power in such a range, a high-density plasma in a desirable dissociation state can be generated in the chamber 1, which makes it possible to perform a plasma processing under a low pressure. In this example, the frequency of the first high frequency power supply 61 is chosen to be 60 MHz.

The susceptor 2 serving as the lower electrode is connected to a second high frequency power supply 65 through a matching unit 66 installed in a feeder line. The second high frequency power supply 65 has a frequency ranging from 100 kHz to 10 MHz. By applying a power of a frequency in such a range, a proper ionic action can be facilitated without causing any damage on the wafer W. In this example, the frequency of the first high frequency power supply 65 is chosen to be 2 MHz.

Hereinafter, there will be described an etching method performed by using the plasma etching apparatus in accordance with the present invention. First, in the plasma etching apparatus, after the gate valve 13 is opened, the wafer W, i.e., a substrate, is loaded from the load-lock chamber (not shown) into the chamber 1 to be mounted on the electrostatic chuck 3. Then, the wafer W is electrostatically adsorbed onto the electrostatic chuck 3 by applying a DC voltage from the high voltage DC power supply 32 thereto. Next, the gate valve 13 is closed, and the inside of the chamber 1 is evacuated to a predetermined vacuum level by using the vacuum pump 12.

Subsequently, the processing gases from the processing gas supply system 53 are introduced into the first gas chamber 45 and the second gas chamber 46 of the gas supply unit 4 through the first gas introduction line 51 and the second gas introduction line 52 while supply amounts are controlled by the flow rate control units F1, F2, respectively. Accordingly, the processing gas is supplied to the center part of the wafer W from the first gas chamber 45 while, at the same time, being supplied to the periphery part of the wafer W from the second gas chamber 46, and the pressure in the chamber 1 is maintained at a predetermined value.

Afterwards, a high frequency of 27 MHz or more, e.g., 60 MHz, is applied to the gas supply unit 4 from the first high frequency power supply 61. Thus, high frequency electric field is generated between the gas supply unit 4 and the susceptor 2, so that the processing gas is dissociated to be converted into a plasma and the wafer W is etched by the plasma.

Meanwhile, a high frequency of 100 kHz~10 MHz, for example, 2 MHz, is applied to the susceptor 2 from the second high frequency power supply 65. Accordingly, ions in the plasma are attracted into the susceptor 2, so that ion assist improves anisotropy of the etching. The wafer W on which the predetermined etching process has been performed as described above is transferred to the outside from the chamber 1, proceeding to a next step.

In the etching method of the present invention, when a SiO-based film such as SiOC film is etched by a gas containing CF-based gas serving as the main etching gas, a larger amount of the CF-based gas is supplied to the center part of the wafer W than the periphery part and vice versa depending on the carbon number of the CF-based gas. Detailed description thereof will be offered below.

First, there will be described a case where the CF-based gas and the dilution gas are mixed before being supplied to the plasma etching apparatus. In such a case, the processing gases supplied to the first gas chamber 45 and the second gas chamber 46 of the gas supply unit 4 in the plasma etching apparatus have a same composition. Thus, flow rates of the processing gases supplied to the first and the second gas chamber 45 and 46 are controlled, whereby the amounts of the CF-based gases included in the processing gases can be controlled to be supplied toward the central and the periphery part.

Specifically, first, there will be described a case of using one kind of the CF-based gas. When the first gas whose carbon number is 2 or less is used as the main etching gas, the processing gases are introduced into the gas supply unit 4 such that per unit area of the gas supply surface of the gas supply unit 4 per unit time, an amount of the first gas supplied to a central portion of the gas supply surface is greater than that supplied to a peripheral portion thereof.

That is, flow rates of the first gas and the dilution gas are controlled to be specified values by the flow rate control units F3 and F5 to thereby produce a processing gas wherein the first gas and the dilution gas are mixed at a predetermined mixing ratio. Then, the processing gases are introduced into the first and the second gas chamber 45 and 46 through the first and the second gas introduction line 51 and 52 at respective flow rates by the flow rate control units F1 and F2 such that the amount of the processing gas supplied into the first gas chamber 45 is greater than that supplied into the second gas chamber 46. Consequently, the central portion of the gas supply surface is supplied with a greater amount of the first gas than the peripheral portion thereof.

Here, "the supply amount of the first gas" used in the present invention means a supply amount thereof per unit area of the gas supply surface per unit time. Further, "the central portion of the gas supply surface is supplied with a greater amount of the first gas than the peripheral portion thereof" means that the number of moles of the first gas supplied to the central portion is greater than that of the first gas supplied to the peripheral portion.

Further, when the second gas having the carbon number of 3 or more is used as the main etching gas, the processing gases are introduced into the gas supply unit 4 such that per unit area of the gas supply surface of the gas supply unit 4 per unit time, an amount of the second gas supplied to the peripheral portion of the gas supply surface is greater than that supplied to the central portion thereof.

That is, flow rates of the second gas and the dilution gas are controlled to be specified values by the flow rate control units F4 and F5 to thereby produce a processing gas wherein the second gas and the dilution gas are mixed at a predetermined mixing ratio. Then, the processing gases are introduced into the first and the second gas chamber 45 and 46 through the first and the second gas introduction line 51 and 52 at respective flow rates by the flow rate control units F1 and F2 such that the amount of the processing gas supplied into the second gas chamber 46 is greater than that supplied into the first gas chamber 45. Therefore, the peripheral portion of the gas supply surface is supplied with a greater amount of the first gas than the central portion thereof.

Here, "the central portion of the gas supply surface" means the gas supply surface of the first gas chamber 45, facing the center part of the wafer W occupying about seven-tenths (square root of a half) of its radius. "The peripheral portion of the gas supply surface" means the gas supply surface of the second gas chamber 46, facing a periphery part of the wafer W surrounding the center part thereof. Further, areas of the central portion and the peripheral portion are designed to be approximately equal to each other. In the plasma etching apparatus, the gas supply surface of the gas supply unit 4 faces the wafer W, and it is configured such that the processing gases are supplied from the first and the second gas chamber 45 and 46 of the gas supply unit 4 toward the central and the periphery part of the wafer W, respectively. Therefore, when the amount of the first gas supplied to the central portion of the gas supply surface is set to be greater than that supplied to the peripheral portion thereof, the amount of the first gas supplied to the center part of the wafer W becomes greater than that supplied to the periphery part thereof. On the other hand, when the amount of the second gas supplied to the peripheral portion of the gas supply surface is set to be greater than that supplied to the central portion thereof, the amount of the second gas supplied to the periphery part of the wafer W becomes greater than that supplied to the center part thereof.

In this case, in the plasma etching apparatus, if the number of the injection openings 41 formed on the bottom surface of the first chamber 45 (injection openings for supplying a gas to the center part of the wafer W) is equal to that of the injection openings 41 formed on the bottom surface of the second chamber 46 (injection openings for supplying a gas to the periphery part of the wafer W) and a gas flow rate ratio of the central portion to the peripheral portion of the gas supply surface is set at 5:5, a gas flow rate from each of the injection openings 41 is constant. However, if the number of the injection openings 41 formed on the bottom surface of the first chamber 45 is different from that of the injection openings 41 formed on the bottom surface of the second chamber 46 or if conductance to the injection openings 41 formed on the bottom surface of the first chamber 45 is different from that to the injection openings 41 formed on the bottom surface of the first chamber 46, adjustment therefor needs to be carried out.

For example, a case where the ratio of the number of the injection openings 41 formed on the bottom surface of the first gas chamber 45 versus that of the injection openings 41 formed on the bottom surface of the second gas chamber 46 is set to be 2:1, if the processing gases are supplied to the center part and the periphery part at a flow rate ratio of 1:2, has a substantially same effect as the case where the processing gases are supplied to the center part and the periphery part at a flow rate ratio of 5:5 in the plasma etching apparatus. Therefore, when, for example, $C_4F_8$ gas is used as the main processing gas, it is preferable that two thirds of the entire processing gas or larger is supplied to the periphery part.

Next, there will be described a case of using two or more kinds of CF-based gas. For example, when the combination of the first gas and the second gas is used, the first gas, the second gas and the dilution gas are mixed at a predetermined mixing ratio by the flow rate control units F3 to F5 to produce the processing gas. The total number of halogen atoms introduced by each of the first and the second gas is calculated. The flow rates are determined depending on the kind of CF-based gas having the greater total number. This is because the etching efficiency is dominated by the number of halogen atoms, and thus the uniformity is dominated by a gas having a greater number of halogen atoms.

For example, in case that the first gas of $CF_4$ gas and the second gas of $C_4F_8$ gas are mixed at a mixing ratio of 15:6 ($CF_4$:$C_4F_8$) to make the processing gas, the total number of F introduced by $CF_4$ gas is 4×15=60, and the total number of F introduced by $C_4F_8$ is 8×6 =48. Namely, the total introduction number of F in the $CF_4$ is greater than $C_4F_8$. Thus, the flow rates are determined by the $CF_4$ gas. A greater amount of the processing gas is introduced to the first gas introduction chamber 45 than to the second gas introduction chamber 46 by controlling the flow rate control units F1, F2 such that the amount of the processing gas supplied to the central portion of the gas supply surface is greater than that supplied to the peripheral portion thereof.

Similarly, in case that the total number of halogen atoms supplied along with the first gas is smaller than that supplied along with the second gas, the amount of the processing gas introduced to the second gas chamber 46 is greater than that introduced to the first gas chamber 45 by controlling the flow rate control units F1 and F2 such that the amount of the processing gas supplied to the peripheral portion of the gas supply surface is greater than that supplied to the central portion thereof.

Figure 3:
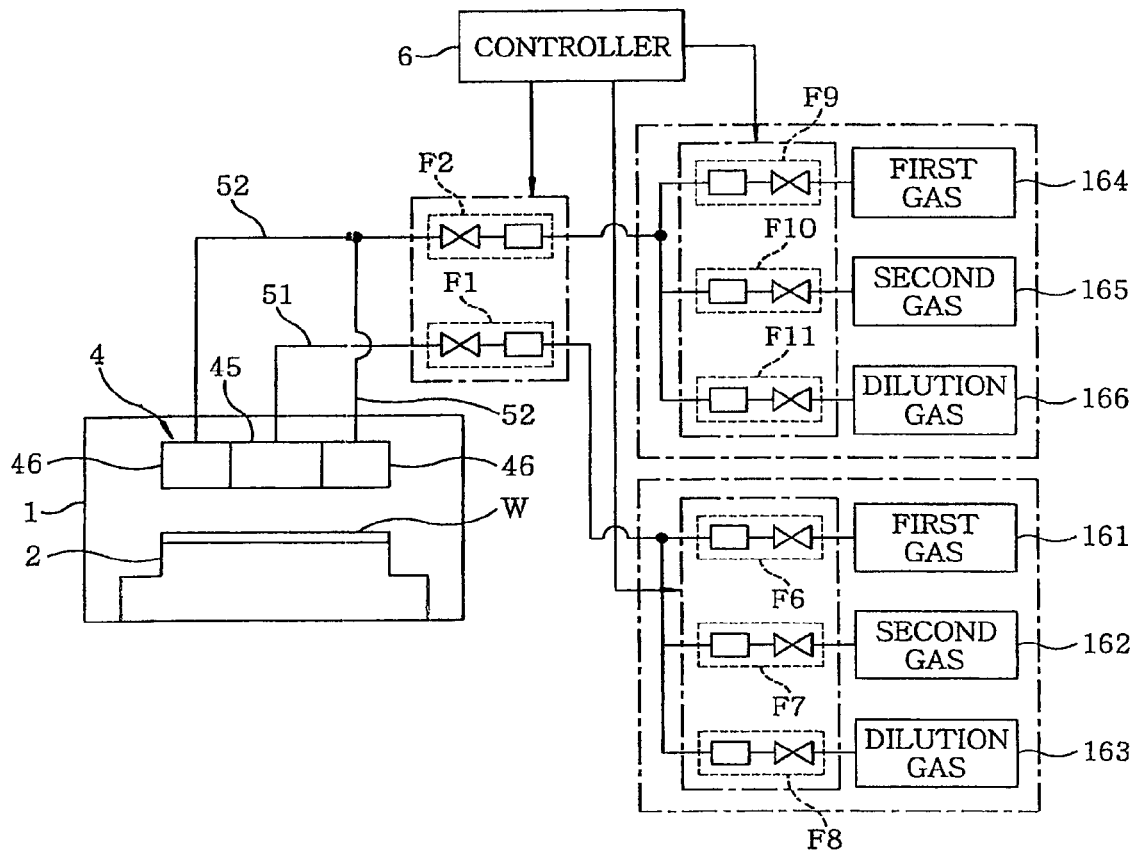
FIG. 3 shows a configuration of another example of a gas supply system of the plasma etching apparatus.

Hereinafter, there will be described a second preferred embodiment of the present invention. In this embodiment, the compositions of processing gases supplied to the central portion and the peripheral portion of the gas supply surface of the gas supply unit 4 are controlled independently, which is realized by, e.g., a plasma etching apparatus shown in FIG. 3. In the plasma etching apparatus shown apparatus, for example, the first gas introduction line 51 provided with the flow rate control unit F1 is connected to a first gas supply source 161 for supplying the first gas, a second gas supply source 162 for supplying the second gas and a dilution gas supply source 163 for supplying the dilution gas via supply lines equipped with flow rate control units F6, F7 and F8, respectively. Further, the second gas introduction line 52 provided with the flow rate control unit F2 is connected to a first gas supply source 164 for supplying the first gas, a second gas supply source 165 for supplying the second gas and a dilution gas supply source 166 for supplying the dilution gas via a supply lines equipped with the flow rate control units F9, F10 and F11.

The flow rate control units F1, F2, F6 to F11 are controlled by the controller 6, and thus the processing gases having different mixing ratios of the first gas, the second gas and the dilution gas (different dilution rates) can be supplied to the first gas chamber 45 and the second gas chamber 46 through the first gas introduction line 51 and the second gas introduction line 52, respectively. And the other configuration is same as the plasma etching apparatus shown in FIG. 1.

In this embodiment, in case that the processing gases have the same composition or that a CF-based gas is only supplied, the flow rates of the processing gases supplied to the first gas chamber 45 and the second gas chamber 46 is controlled, thereby controlling the total number of fluorine atoms (halogen atoms) supplied to the central portion of the gas supply surface and that supplied to the peripheral portion thereof. Besides, the processing gases having the different compositions can be supplied to the plasma etching apparatus. Accordingly, by varying compositions of the processing gases, that is, dilution rates of the CF-based gases, while flow rates of the processing gases supplied to the first gas chamber 45 and the second gas chamber 46 are kept to be equal, the total number of fluorine atoms (halogen atoms) supplied to the central portion of the gas supply surface and that supplied to the peripheral portion thereof may be controlled.

At this time, in case the first gas having the carbon number of 2 or less is used as the main etching gas, the amount of the first gas supplied to the first gas chamber 45 and that supplied to the second gas chamber 46 are controlled such that the total number of fluorine atoms supplied to the central portion of the gas supply surface is greater than that of fluorine atoms supplied to the peripheral portion thereof.

For example, in case that $CF_4$ gas is used as the first gas and the dilution gas is not used, the flow rate of $CF_4$ gas supplied to the first gas chamber 45 is set at 100 sccm by the flow rate control units F1 and F6; and the flow rate of $CF_4$ gas supplied to the second gas chamber 46 is set at 50 sccm by the flow rate control units F2 and F9. In other words, the gas flow rate supplied to the central portion of the gas supply surface is 100 sccm; and the gas flow rate supplied to the peripheral portion thereof is 50 sccm, so that the total number of fluorine atoms supplied to central portion of the gas supply surface is greater that supplied to the peripheral portion thereof. In this case, a single flow rate control unit may be provided between the first gas chamber 45 and the first gas supply source 161 or between the first gas chamber 45 and the second gas supply source 162. Further, it is possible to provide only one flow rate control unit between the second gas chamber 46 and the first gas supply source 164 or between the second gas chamber 46 and the second gas supply source 165.

Further, for example, in case that the first gas of $CF_4$ gas and the dilution gas of Ar gas are employed while varying the dilution rates of the first gases supplied to the central portion and the peripheral portion of the gas supply surface, the first gas having a flow rate of 50 sccm and the dilution gas having a flow rate of 100 sccm are supplied to first gas introduction line 51 via the flow rate control units F6 and F8 while, at the same time, the first gas having a flow rate of 50 sccm and the dilution gas having a flow rate of 300 sccm are supplied to the second gas introduction line 52 via the flow rate control units F9 and F11. Then, by controlling the flow rate control units F1 and F2, processing gases of the same flow rate are supplied to the first gas chamber 45 and the second gas chamber 46 from the first gas introduction line 51 and the second gas introduction line 52, respectively.

As described above, by supplying the processing gases at a same flow rate to the first gas chamber 45 and the second gas chamber 46; and making the dilution rate of the first gas diluted with the dilution gas greater in the processing gas supplied to the second gas chamber 46 than in the processing gas supplied to the first gas chamber 45, the total number of fluorine atoms supplied to the central portion of the gas supply surface can be controlled to be greater than that of fluorine atoms supplied to the peripheral portion thereof.

Similarly, in case of using the second gas having the carbon number of 3 or more as the main etching gas, amounts of the second gases supplied to the central portion and the peripheral portion of the gas supply surface are controlled such that the total number of fluorine atoms in the second gas supplied to the central portion of the gas supply surface is smaller than that of the halogen atoms of the second gas supplied to the peripheral portion thereof.

In the same way as in the case of using the first gas, in case that the processing gases have the same composition or that a CF-based gas is only supplied, the larger amount of the second gas is supplied to the second gas chamber 46 that the first gas chamber 45, so that it can be controlled that the total number of fluorine atoms supplied to the peripheral portion of the gas supply surface is greater than that of fluorine atoms supplied to the central portion thereof. Besides, by varying compositions of the processing gases, that is, dilution rates of the second gases, while the amounts of the processing gases supplied to the first gas chamber 45 and the second gas chamber 46 are kept to be equal, it can be controlled that the total number of fluorine atoms supplied to the peripheral portion of the gas supply surface is greater than that supplied to the central portion thereof may be controlled.

Further, in case the first gas having the carbon number of 2 or less and the second gas having a carbon number of 3 or more are mixed, the total number of halogen atoms introduced by each CF-based gas is calculated, and then it is determined whether more halogen atoms are supplied to the central portion or the peripheral portion of the gas supply surface by the CF-based gas having a greater number of halogen atoms.

When the processing gases having different mixing ratios of the first gas to the second gas are respectively supplied to the first gas chamber 45 and the second gas chamber 46, for example, when a first processing gas having a first mixing ratio of the first gas to the second gas is supplied to the first gas chamber 45 and a second processing gas having a second mixing ratio of the first gas to the second gas is supplied to the second gas chamber 46, after calculating the total number of halogen atoms introduced by each CF-based gas in the entire processing gas including the first and the second processing gas, the amount of the first gas supplied to the first gas chamber 45 and the amount of the second gas supplied to the second gas chamber 46 are determined by the CF-based gas having a greater number of halogen atoms.

That is, in case the number of fluorine atoms introduced by the first gas is greater than that introduced by the second gas, the flow rates of the first processing gas and the second processing gas are controlled by the flow rate control units F1 and F2 such that the amount of the first processing gas supplied to the first gas chamber 45 is greater than that of the second processing gas supplied to the second gas chamber 46.

On the other hand, in case the number of fluorine atoms introduced by the second gas is greater than that introduced by the first gas, the flow rates of the first processing gas and the second processing gas are controlled by the flow rate control units F1 and F2 such that the amount of the first processing gas supplied to the first gas chamber 45 is smaller than that of the second processing gas supplied to the second gas chamber 46.

In this case, the mixing ratio of the first gas to the second gas in the first processing gas is controlled by the flow rate control units F6 and F7, while the mixing ratio of the first gas to the second gas in the second processing gas is controlled by the flow rate control units F9 and F10. Then, the amounts of the first and the second processing gas to be supplied to the first gas chamber 45 and the second gas chamber 46 are controlled by the flow rate control units F1 and F2, respectively.

Further, in case the first gas having the carbon number of 2 or less and the second gas having the carbon number of 3 or more are mixed, the amounts of the first gas and the second gas respectively supplied to the first gas chamber 45 and the second gas chamber 46 may be controlled such that a greater amount of the first gas is supplied to the central portion than to the peripheral portion and that a greater amount of the second gas is supplied to the peripheral portion than to the central portion.

Specifically, for example, in case $CF_4$ gas is used as the first gas and $C_4F_8$ is used as the second gas, $C_4F_8$ gas having a flow rate of 2 sccm and $CF_4$ gas having a flow rate of 10 sccm are supplied to the first gas chamber 45, while $C_4F_8$ having a flow rate of 4 sccm and $CF_4$ gas having a flow rate of 5 sccm are supplied to the second gas chamber 46. By doing so, the processing gas in the central portion of the gas supply surface has a greater amount of the first gas and a smaller mixing ratio of the second gas to the first gas than the processing gas in the peripheral portion. Further, the processing gas in the peripheral portion has a greater amount of the second gas and a greater mixing ratio of the second gas to the first gas than the processing gas in the central portion. Therefore, the flow rate of the first gas is controlled in such a manner that a greater amount of fluorine atoms is supplied to the central portion than to the peripheral portion of the gas supply surface, while the flow rate of the second gas is controlled in such a manner that a greater amount of fluorine atoms is supplied to the peripheral portion than to the central portion.

In this case, the amount of the first gas supplied to the first gas chamber 45 is controlled by the flow rate control unit F1 or F6, while the amount of the first gas supplied to the second gas chamber 46 is controlled by the flow rate control unit F2 or F9. Further, the amount of the second gas supplied to the first gas chamber 45 is controlled by the flow rate control unit F1 or F7, while the amount of the second gas supplied to the second gas chamber 46 is controlled by the flow rate control unit F2 or F10. Accordingly, in this embodiment, only one flow rate control unit may be installed between the first gas chamber 45 and the first gas supply source 161; between the first gas chamber 45 and the second gas supply source 162; between the second gas chamber 46 and the first gas supply source 164; or between the second gas chamber 46 and the second gas supply source 165.

Further, in case the first gas having carbon number of two or less and the second gas having a carbon number of three or more are mixed with each other as described above, if the amount of the processing gas supplied to the first gas chamber 45 is equal to that supplied to the second gas chamber 46, the ratio of the first gas to the processing gas is set to be greater in the central portion than in the peripheral portion of the gas supply surface, while the ratio second gas to the processing gas is set to be greater in the peripheral portion than in the central portion of the gas supply surface.

Further, in case the first gas having a carbon number of two or less and the second gas having a carbon number of three or more are mixed with each other, the flow rate of the first gas may be controlled such that the same amount of the first gas is supplied to the first gas chamber 45 and the second gas chamber 46, whereas the flow rate of the second gas may be controlled such that a greater amount of the second gas is supplied to the second gas chamber 46 than to the first gas chamber 45 to thereby supply it to the peripheral portion than to the central portion of the gas supply surface. For example, the first gas chamber 45 is supplied with a gaseous mixture containing $C_4F_8$ gas having a flow rate of 2 sccm and $CF_4$ gas having a flow rate of 10 sccm, while the second gas chamber 46 is supplied with a gaseous mixture containing $C_4F_8$ gas having a flow rate of 4 sccm and $CF_4$ gas having a flow rate of 10 sccm.

At this time, by maintaining the flow rates of the processing gases supplied to the first gas chamber 45 and the second gas chamber 46 to be equal, and at the same time, making the ratio of the first gas to the processing gas in the first gas chamber 45 equal to that in the second gas chamber 46, it is possible to set the ratio of the second gas to the processing gas to be greater in the peripheral portion than in the central portion of the gas supply surface.

Further, the flow rate of the second gas may be controlled such that the same amount of the second gas is supplied to the first gas chamber 45 and the second gas chamber 46, whereas the flow rate of the first gas may be controlled such that a greater amount of the first gas is supplied to the first gas chamber 45 than to the second gas chamber 46 to thereby supply it to the central portion than to the peripheral portion of the gas supply surface. For example, the first gas chamber 45 is supplied with a gaseous mixture containing $C_4F_8$ gas having a flow rate of 2 sccm and $CF_4$ gas having a flow rate of 10 sccm, while the second gas chamber 46 is supplied with a gaseous mixture containing $C_4F_8$ gas having a flow rate of 2 sccm and $CF_4$ gas having a flow rate of 5 sccm.

At this time, by maintaining the flow rates of the processing gases supplied to the first gas chamber 45 and the second gas chamber 46 to be equal, and at the same time, making the ratio of the second gas to the processing gas in the first gas chamber 45 equal to that in the second gas chamber 46, it is possible to set the ratio of the first gas to the processing gas to be greater in the central portion than in the peripheral portion of the gas supply surface.

By doing so, the processing gas in the central portion of the gas supply surface has a smaller mixing ratio of the second gas to the first gas than the processing gas in the peripheral portion. Further, the processing gas in the peripheral portion has a greater mixing ratio of the second gas to the first gas than the processing gas in the central portion. Therefore, the flow rate of the first gas is controlled in such a manner that a greater amount of fluorine atoms is supplied to the central portion than to the peripheral portion of the gas supply surface, while the flow rate of the second gas is controlled in such a manner that a greater amount of fluorine atoms is supplied to the peripheral portion than to the central portion.

Also in this case, the amount of the first gas supplied to the first gas chamber 45 is controlled by the flow rate control unit F1 or F6, while the amount of the first gas supplied to the second gas chamber 46 is controlled by the flow rate control unit F2 or F9. Further, the amount of the second gas supplied to the first gas chamber 45 is controlled by the flow rate control unit F1 or F7, while the amount of the second gas supplied to the second gas chamber 46 is controlled by the flow rate control unit F2 or F10. Accordingly, a single flow rate control unit may be installed between the first gas chamber 45 and the first gas supply source 161; between the first gas chamber 45 and the second gas supply source 162; between the second gas chamber 46 and the first gas supply source 164; or between the second gas chamber 46 and the second gas supply source 165.

Further, in accordance with the present invention, in case the total number of halogen atoms supplied along with the first gas is greater than that of supplied along with the second gas, the composition of the processing gas or the supply amount of the processing gas may be controlled in such a manner that the total number of halogen atoms per unit area of the gas supply surface per unit time is greater in the central portion than in the peripheral portion. In such a case, the number of halogen atoms supplied along with the first gas and the second gas is greater in the central portion than in the peripheral portion of the gas supply surface.

At this time, in case the total number of halogen atoms supplied along with the first gas is smaller than that supplied along with the second gas, the composition of the processing gas or the supply amount of the processing gas may be set in such a manner that the total number of halogen atoms per unit area of the gas supply surface per unit time is greater in the peripheral portion than in the central portion. In such a case, the number of halogen atoms supplied along with the first gas and the second gas is greater in the peripheral portion than in the central portion of the gas supply surface.

In the above-mentioned methods, according to the carbon number of the CF-based gas, the amount of CF-based gas supplied to the central portion is controlled to be greater or smaller than that supplied to the peripheral portion of the gas supply surface. Therefore, as will be clear in embodiments to be described later, it is possible to secure the in-surface uniformity of etching characteristics, such as an etching rate or processing accuracy after etching, such as a top CD, a bottom CD, an etching residual film, an etching depth and a hole shape.

At this time, it has been determined in advance, depending on the carbon number in CF-based gas, which of the central portion and the peripheral portion of the gas supply surface is supplied with more halogen atoms. Therefore, it narrows down the scope of parameters used in determining the most appropriate condition for the flow rates and compositions of the processing gases supplied to the central portion and the peripheral portion of the gas supply surface and the like, readily setting the condition.

<Embodiments>

Hereinafter, an evaluation method of the present invention will be described. From various data obtained from the experiments, the inventors of the present invention found that a greater amount of the first gas having the carbon number of two or less is supplied to the central portion than to the peripheral portion of the gas supply surface, and a greater amount of the second gas having the carbon number of three or more is supplied to the peripheral portion than to the central portion of the gas supply surface in order to increase the in-surface uniformity of the etching characteristics such as the etching rate or processing accuracy after etching.

First, a description will be offered on experiment examples conducted to prove the mechanism of the present invention.

Figure 4:
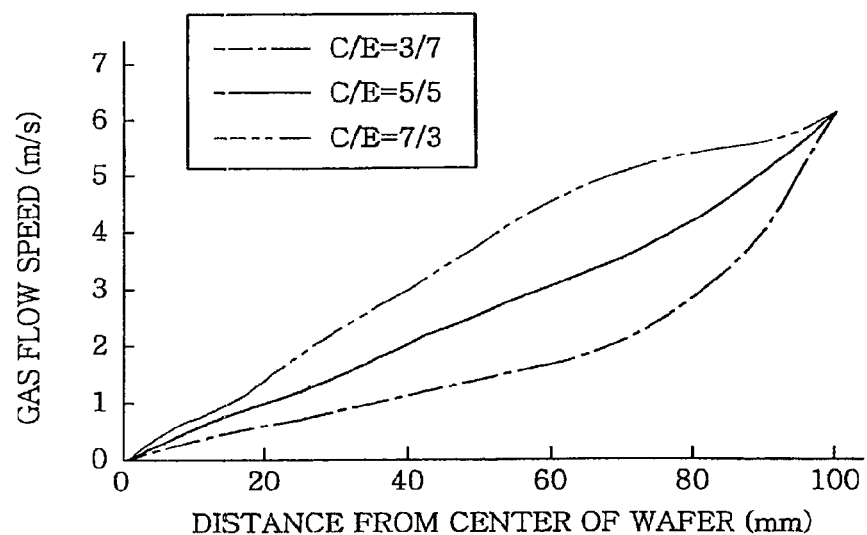
FIG. 4 offers a characteristic graph showing simulation results for in-surface uniformity of a gas flow speed.

FIG. 4 provides simulation results of gas flow speed distribution near the surface of the wafer W when the amounts of CF-based gases supplied to the central portion and the peripheral portion of the gas supply surface are changed by changing the flow rate ratio of the processing gas supplied to the first gas chamber 45 (the central portion of the gas supply surface) versus the processing gas supplied to the second gas chamber 46 (the peripheral portion of the gas supply surface) in the above-described plasma etching apparatus, wherein it was assumed that the CF-based gas was $C_4F_8$. In FIG. 4, the vertical axis represents the gas flow speed and the horizontal axis represents the distance from the center of the wafer W. Further, a flow rate ratio C/E is a flow rate in the central portion (C) to a flow rate in the peripheral portion (E) of the gas supply surface, wherein a dashed dotted line indicates a case of C/E=3/7; a solid line, a case of C/E=5/5; and a dashed double-dotted line, a case of C/E=7/3. Further, the flow rate ratio C/E of 3/7 means that three-tenths of the flow rate of the entire processing gas is supplied to the central portion of the gas supply surface, while seven-tenths of the flow rate of the entire processing gas is supplied to the peripheral portion.

As a result, it is known that when a greater amount of the processing gas is supplied to the central portion than to the peripheral portion of the gas supply surface, the gas flow speed is the highest, and when a greater amount of the processing gas is supplied to the peripheral portion than to the central portion, the gas flow speed is the lowest. When a greater amount of the processing gas is supplied to the central portion than to the peripheral portion, since the acceleration of the gas flow speed is greater compared to the case of supplying a greater amount of the processing gas to the peripheral portion, it is inferred that the gas flows quickly from the center of the wafer W to the edge thereof.

On the other hand, when a greater amount of the processing gas is supplied to the peripheral portion than to the central portion, since the gas flow speed is low in the center part of the wafer W and becomes high suddenly in the periphery part thereof, it is inferred that the gas is stagnant in the center part, so that there are a large number of molecules whose residence time is long in the center part.

As for a CF-based gas whose molecule has a small carbon number of two or less, an etching action is strong due to a high ratio of F/C and the in-surface uniformity of etching rate is depended on the residence time of the gas. Therefore, when a greater amount of the gas is supplied to the peripheral portion, the residence time of the gas in the center part becomes long, resulting in an excessive etching compared to the periphery part, thereby deteriorating the in-surface uniformity. Contrarily, when a greater amount of the gas is supplied to the central portion, since the gas flows quickly from the center to the edge of the wafer W, it is inferred that the residence time of the gas within the wafer W is more likely to be uniform, thus showing a high in-surface uniformity of the etching rate. Further, as for a CF-based gas whose molecule has a large carbon number of three or more, polymerization action is high due to a low ratio of F/C, and it is inferred that in-surface uniformity of the etching characteristics is more affected by distribution of active species than by the residence time of the gas.

Figure 5:
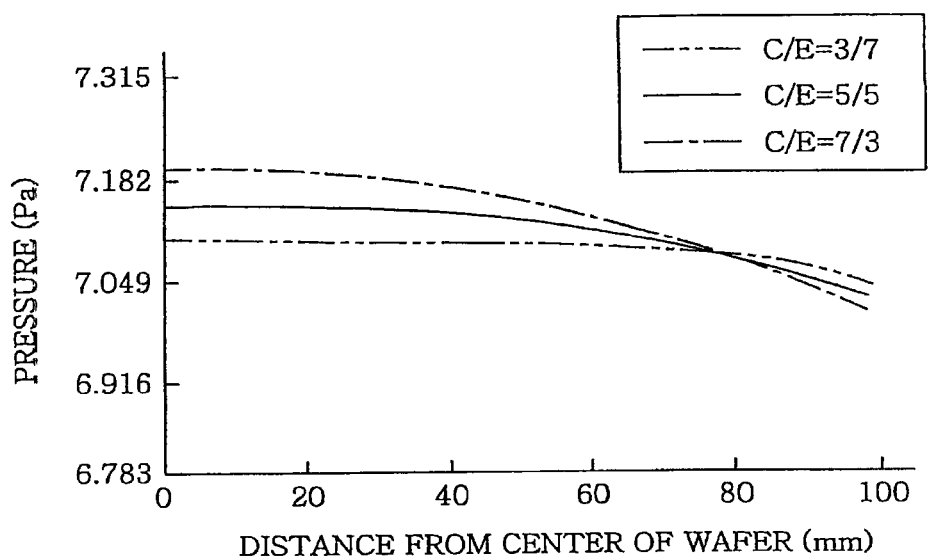
FIG. 5 presents a characteristic graph showing simulation results for in-surface uniformity of a pressure.

Therefore, as shown in FIG. 5, simulation was performed to obtain pressure distribution near the surface of the wafer W when the flow rate ratio of the processing gas supplied to the central portion and the processing gas supplied to the peripheral portion of the gas supply surface is changed, wherein it was assumed that the CF-based gas was $C_4F_8$. In FIG. 5, the vertical axis represents the pressure, while the horizontal axis represents the distance from the center of the wafer W. Further, a dashed double-dotted line indicates a case of C/E=3/7; a solid line, a case of C/E=5/5; and a dashed dotted line, a case of C/E=7/3.

As a result, it was known that when a greater amount of the processing gas is supplied to the peripheral portion than to the central portion of the gas supply surface, the most uniform pressure distribution within the surface of the wafer W is achieved. The uniform pressure distribution means that the density of molecules in the processing gas and the density of active species present within the surface of the wafer W become uniform. As described above, in case of the CF-based gas having the carbon number of three or more, it is inferred that, when a greater amount of the processing gas is supplied to the peripheral portion than to the central portion, active species are more likely to exist uniformly throughout the surface of the wafer W, thus increasing the in-surface uniformity of the etching.

Further, to support this, a film forming process was performed on a bare silicon by plasma of the processing gas under the following processing condition in the plasma etching apparatus shown in FIG. 1 while varying the flow rates of the processing gases supplied to the central portion and the peripheral portion of the gas supply surface, wherein $C_5F_8$ was used as CF-based gas, and Ar gas and $O_2$ gas are used as the dilution gas. Then, the in-surface uniformity of the film forming speed was measured.

Figure 6:
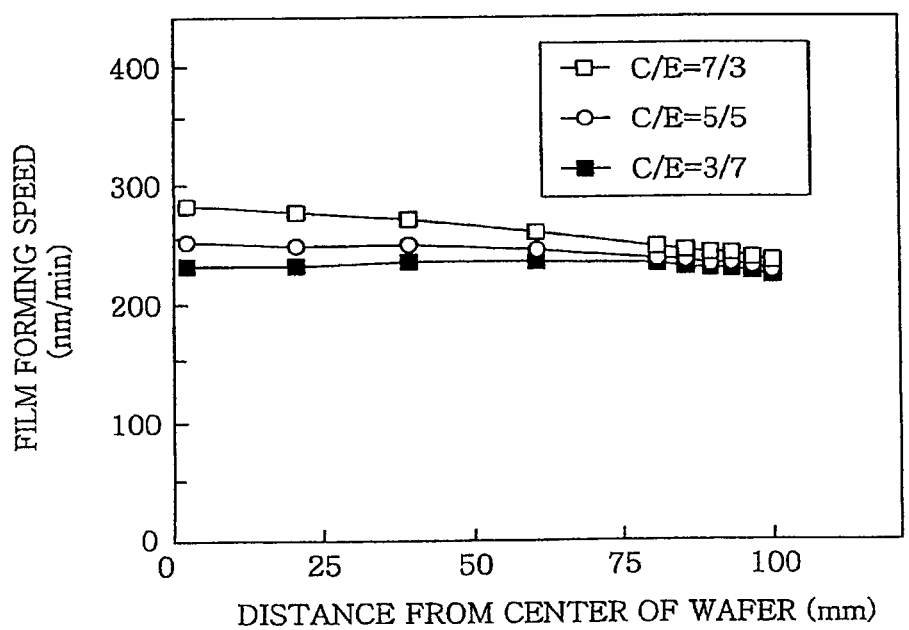
FIG. 6 depicts a characteristic graph showing in-surface uniformity of a film formation speed.

<Processing Condition>
Flow rate ratio of $C_5F_8$ gas, Ar gas and $O_2$ gas;
 $C_5F_8$:Ar:$O_2$=15:380:19 sccm
Processing pressure; 1.995 Pa (15 mTorr)
Processing temperature; 20° C.
Frequency and power of the first high frequency power supply 61; 60 MHz, 2170 W
Frequency and power of the second high frequency power supply 65; 2 MHz, 0 W Results are shown in FIG. 6, wherein the vertical axis represents the film forming speed, while the horizontal axis represents the distance from the center of the wafer W. Further, □ indicates a case of the flow rate ratio C/E=7/3; ○ represents a case of C/E=5/5; and ■ represents a case of C/E=3/7. From these results, it is proved that when the flow rate ratio C/E is 3/7, the film forming speed is the most uniform throughout the surface of the wafer W. Therefore, it is confirmed that when the flow rate supplied to the peripheral portion is greater than that supplied to the central portion, the pressure distribution becomes uniform, so that the density of active species becomes uniform throughout the surface of the wafer W.

Hereinafter, respective embodiments will be described.

(Embodiment 1)

After the processing gas was produced in advance by mixing $CHF_3$ gas employed as the CF-based gas; and Ar gas and $N_2$ gas employed as the dilution gas, an etching process was performed on a resist layer (formed on an entire surface of the wafer W without patterns formed thereon) formed on the wafer W under the following processing condition by introducing the processing gas into the plasma etching apparatus shown in FIG. 1 while varying the amounts of the processing gases supplied to the central portion and the peripheral portion of the gas supply surface. Then, the in-surface uniformity of CF density and $CF_2$ density on the wafer W was measured by utilizing an LIF (laser induced fluorescence) technology. The flow rate ratios C/E of the processing gases were set to be 0/10, 3/7, 5/5, 7/3 and 10/0. Further, the flow rate ratio C/E of 0/10 means a case where the processing gas is supplied only to the peripheral portion of the gas supply surface.

Figure 7A:
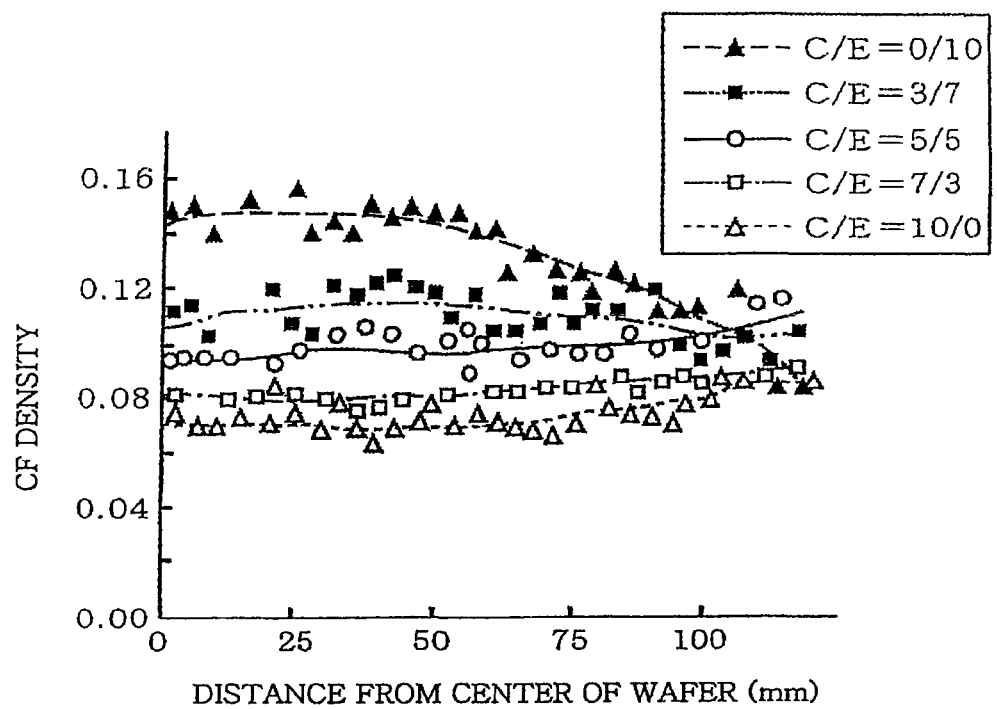
FIGS. 7A and 7B are, respectively, characteristic graphs showing in-surface uniformity of CF density and $CF_2$ density in Embodiment 1.
Figure 7B:
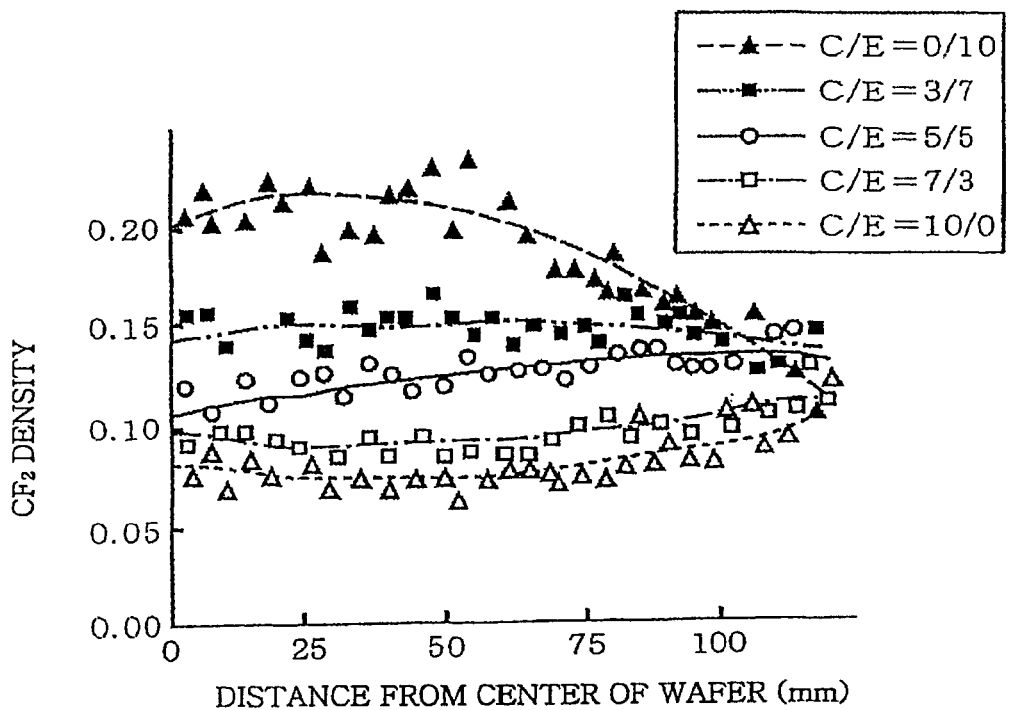

<Processing Condition>
Flow rate ratio of $CHF_3$ gas, Ar gas and $N_2$ gas;
 $CHF_3$:Ar:$N_2$=40:1000:80 sccm
Processing pressure; 6.65 Pa (50 mTorr)
Frequency and power of the first high frequency power supply 61; 60 MHz, 1200 W
Frequency and power of the second high frequency power supply 65; 2 MHz, 1700 W FIG. 7A shows the in-surface uniformity of CF density, and FIG. 7B presents the in-surface uniformity of $CF_2$ density. In FIGS. 7A and 7B, the vertical axis represents CF density and $CF_2$ density, respectively, while the horizontal axis represents the distance from the center of the wafer W. Further, ▲ indicates a case of the flow rate ratio C/E=0/10; ■ indicates a case of C/E=7/3; ○ represents a case of C/E=5/5; □ represents a case of C/E=3/7; and △ represents a case of C/E=10/0.

From these results, it is known that both CF density and $CF_2$ density are more uniform within the surface of the wafer W when the flow rate is higher in the central portion of the gas supply surface than that in the peripheral portion. At this time, when the flow rate is higher in the peripheral portion, CF density is high in the center part of the wafer W, while it is low in the periphery part of the wafer W. Thus, it is inferred that gas stagnation occurs in the center part of the wafer W as described above. Contrarily, when the flow rate is higher in the central portion, the density is low in the center part of the wafer W and is almost uniform on the surface of the wafer W. Thus, it is inferred that the high in-surface uniformity of the gas flow speed distribution as described above helps, for example, CF density become uniform within the surface of the wafer W.

As described above, in case of the first gas having the carbon number of two or less, it is inferred that when the flow rate of the central portion is higher, the amount of active species of CF or $CF_2$, active species of CF-based gas, becomes uniform within the surface of the wafer W, so that the etching rate throughout the surface of the wafer W becomes uniform. Further, the inventors of the present invention conducted a same experiment by using $C_4F_8$ gas as that conducted by using $CHF_3$ gas, but since measurement values of LIF were small and less reliable, the measurement data are not presented.

(Embodiment 2)

After the processing gas was produced in advance by mixing $CHF_3$ gas employed as the CF-based gas; and Ar gas and $N_2$ gas employed as the dilution gas, an etching process was performed on an etching target film (SiOC film) formed on the wafer W under the following processing condition by introducing the processing gas into the plasma etching apparatus shown in FIG. 1 while varying the flow rates of the processing gases supplied to the central portion and the peripheral portion of the gas supply surface. Then, the in-surface uniformity of a residual resist film, an etching depth, a top CD and a bowing position was evaluated. Here, the flow rate ratios C/E of the processing gases supplied to the central portion and the peripheral portion of the gas supply surface were set to be 1/9, 5/5 and 9/1.

Figures 8A, 8B:
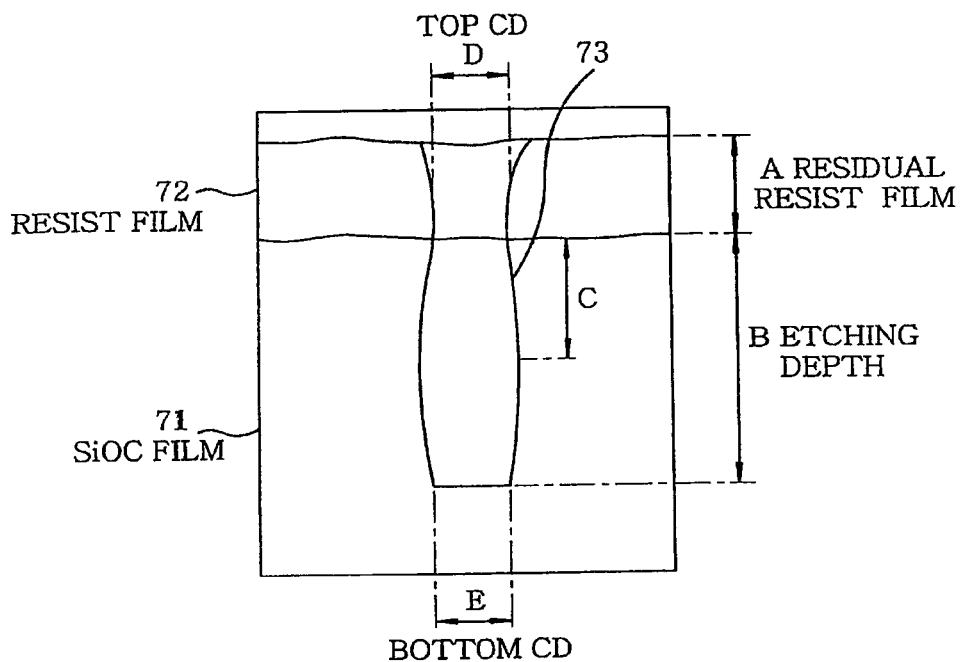
FIGS. 8A and 8B show in-surface uniformity of a residual resist film, an etching depth, a top CD and a bowing position in Embodiment 2.

In FIG. 8A, a reference numeral 71 refers to the SiOC film serving as the etching target film; and a reference numeral 72 refers to a resist film formed on the surface of the SiOC film. The residual resist film is represented by a distance A; the etching depth, a distance B; the bowing position, a distance C from the top surface of the SiOC film to the greatest diameter portion of a hole (recessed portion) 73 formed in the SiOC film; and the top CD, a top diameter D of the hole (recessed portion) 73 formed in the SiOC film.

Further, the distances A, B, C and the diameter D were measured in the center part and the periphery part of the wafer W by using a cross-sectional SEM (scanning electronic microscope) image of films after etching, and in-surface uniformity thereof was evaluated in such a manner that the smaller a difference between values in the center part and the periphery part is, the better the in-surface uniformity gets. The center part of the wafer W means a rotational center of the wafer W and the periphery part of the wafer W means a position 5 mm away from the outer periphery of the wafer W. The definitions of the residual resist film, the etching depth, the bowing position and the top CD, the data measurement method and the method of evaluating the in-surface uniformity based on the difference between data values in the center part and the periphery part of the wafer W are the same also in the following embodiments.

<Processing Condition>

Flow rate ratio of $CHF_3$ gas, Ar gas and $N_2$ gas; $CHF_3$:Ar:$N_2$=40:1000:80 sccm Processing pressure; 6.65 Pa (50 mTorr)

Frequency and power of the first high frequency power supply 61; 60 MHz, 1200 W

Frequency and power of the second high frequency power supply 65; 2 MHz, 1700 W

The results are tabled in FIG. 8B. In case of $CHF_3$ gas, for the residual resist film, the etching depth, the top CD, and the bowing position, the difference (absolute value) between values in the center part and the periphery part of the wafer W was smaller when a greater flow rate is supplied to the central portion than to the peripheral portion. Also from this embodiment, it is understood that in case of CF-based gas having the carbon number of two or less, when a greater flow rate is supplied to the central portion than to the peripheral portion, the etching rate becomes more uniform within the surface of the wafer W, thus improving the in-surface uniformity of the etching characteristics of the residual resist film, the etching depth, the top CD, the bowing position.

(Embodiment 3)

After the processing gas was produced in advance by mixing $CHF_3$ gas employed as the CF-based gas; and Ar gas, $N_2$ gas and $O_2$ gas employed as the dilution gas, an etching process was performed on an etching target film (SiOCH film) formed on the wafer W under the following processing condition by introducing the processing gas into the plasma etching apparatus shown in FIG. 1 while varying the flow rates of the processing gases supplied to the central portion and the peripheral portion of the gas supply surface. Then, the in-surface uniformity of the top CD and the etching depth formed by etching was evaluated.

<Processing Condition>

Processing pressure; 6.65 Pa (50 mTorr)

Frequency and power of the first high frequency power supply 61; 60 MHz, 1500 W

Frequency and power of the second high frequency power supply 65; 2 MHz, 2800 W

Figure 9A:
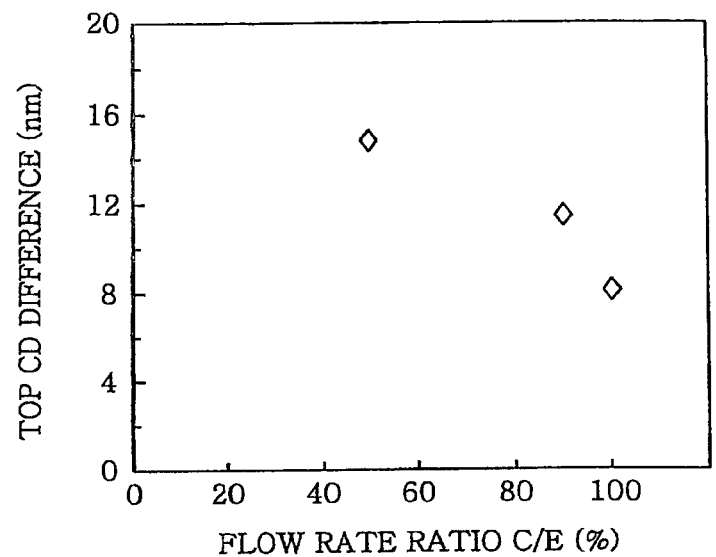
FIGS. 9A and 9B are characteristic graphs showing in-surface uniformity of absolute values of a top CD difference and a etching depth, respectively, in Embodiment 3.
Figure 9B:
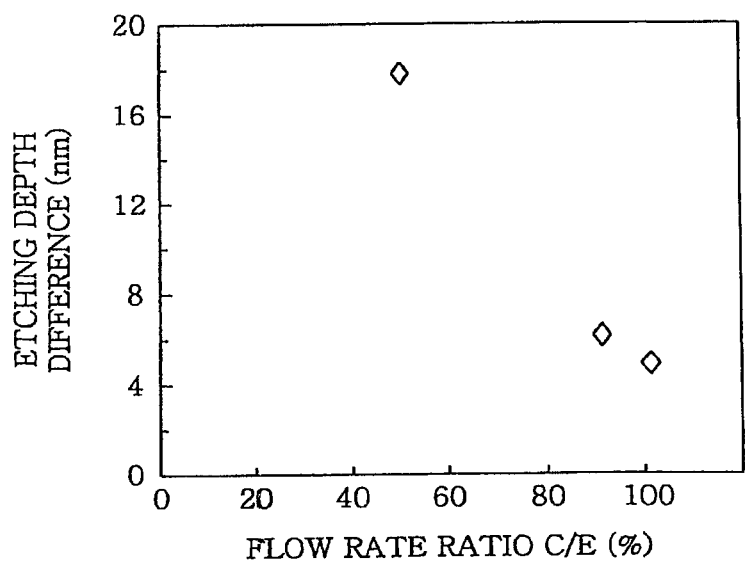

FIGS. 9A and 9B show the in-surface uniformity of the top CD and the in-surface uniformity of the etching depth, respectively. In FIG. 9A, the vertical axis represents an absolute value of difference of the top CD between the center part and the periphery part. In FIG. 9B, the vertical axis represents an absolute value of difference of the etching depth between the center part and the periphery part. Further, in FIGS. 9A and 9B, the horizontal axis represents the flow rate ratio C/E of gases supplied to the central portion and the peripheral portion. For example, the flow rate ratio 50% means that the flow rate ratio C/E is 5/5, and the flow rate 90% means that the flow rate ratio C/E is 9/1.

From these results, it is proved that when the flow rate supplied to the central portion of the gas supply surface is greater, the difference of the top CD and the etching depth between the center part and the periphery part of the wafer W is smaller, showing higher in-surface uniformity. Therefore, also from this embodiment, it is understood that in case of the first gas having the carbon number of two or less, when a greater flow rate is supplied to the central portion than to the peripheral portion, the etching rate becomes more uniform within the surface of the wafer W.

(Embodiment 4)

After the processing gas was produced in advance by mixing $CH_2F_2$ gas employed as the CF-based gas; and $O_2$ gas employed as the dilution gas, an etching process was performed on an etching target film (laminated film consisting of SiO film and SiOCH film) formed on the wafer W under the following processing condition by introducing the processing gas into the plasma etching apparatus shown in FIG. 1 while varying the flow rates of the processing gases supplied to the central portion and the peripheral portion of the gas supply surface. Then, the in-surface uniformity of the residual resist film, the top CD, the bottom CD and the recess was evaluated. Here, the flow rate ratios C/E of the processing gases supplied to the central portion and the peripheral portion were set to be 1/9, 5/5 and 9/1.

<Processing Condition>

Flow rate ratio of $CH_2F_2$ gas, and $O_2$ gas; $CH_2F_2$:$O_2$=40:20 sccm

Processing pressure; 7.98 Pa (60 mTorr)

Frequency and power of the first high frequency power supply 61; 60 MHz, 700 W

Frequency and power of the second high frequency power supply 65; 2 MHz, 300 W

The bottom CD is represented by a diameter E of a bottom portion of the hole 73 formed in the etching target film (SiOC film) 71 shown in FIG. 8A, and the recess means an etching amount of an underlying film of the etching target film. Further, data on the evaluation items were measured in the center part and the periphery part of the wafer W by using a cross-sectional SEM image of films after etching, and in-surface uniformity thereof was evaluated in such a manner that the smaller a difference between values in the center part and the periphery part is, the better the in-surface uniformity gets. The definitions of the bottom CD, the recess, the data measurement method and the method of evaluating the in-surface uniformity based on the difference between data values in the center part and the periphery part of the wafer W are the same also in the following embodiments.

From results shown in FIG. 10, it is proved that when the flow rate ratio C/E is 9/1, the difference of the top CD, the bottom CD and the recess between the center part and the periphery part of the wafer W is smaller, showing higher in-surface uniformity. Therefore, also from this embodiment, it is understood that in case of the first gas having the carbon number of two or less, when a greater flow rate is supplied to the central portion than to the peripheral portion, the etching rate becomes more uniform within the surface of the wafer W.

(Embodiment 5)

After the processing gas was produced in advance by mixing $C_4F_8$ gas employed as the CF-based gas; and Ar gas and $N_2$ gas employed as the dilution gas, an etching process was performed on an etching target film (laminated film formed by laminating a tetraethyl orthosilicate (TEOS) film having the thickness of 50 nm and an bottom anti-reflection coating (BARC) having the thickness of 100 nm on a SiOC film) formed on the wafer W under the following processing condition by introducing the processing gas into the plasma etching apparatus shown in FIG. 1 while varying the flow rates of the processing gases supplied to the central portion and the peripheral portion of the gas supply surface. Then, a shape of a hole formed by etching was evaluated. Here, the flow rate ratios C/E of the processing gases supplied to the central portion and the peripheral portion were set to be 1/9, 5/5 and 9/1.

<Processing Condition>
Flow rate ratio of $C_4F_8$ gas, Ar gas and $N_2$ gas;
$C_4F_8$:Ar:$N_2$=5:1000:150 sccm
Processing pressure; 6.65 Pa (50 mTorr)
Frequency and power of the first high frequency power supply 61; 60 MHz, 500 W
Frequency and power of the second high frequency power supply 65; 2 MHz, 2000 W The hole shape was evaluated by measuring a taper angle θ formed between an outer surface 74 of a sidewall of the hole 73 and an extension line 75 from a bottom surface of the hole, and calculating the difference of the taper angle θ of the hole between the center part and the periphery part. The smaller difference means the better in-surface uniformity of the hole shape.

Figure 11A:
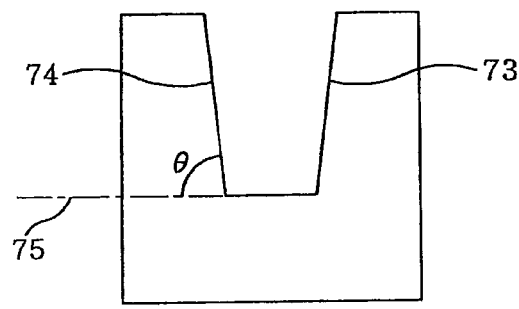
FIGS. 11A and 11B present in-surface uniformity of a taper angle θ in Embodiment 5.
Figure 11B:
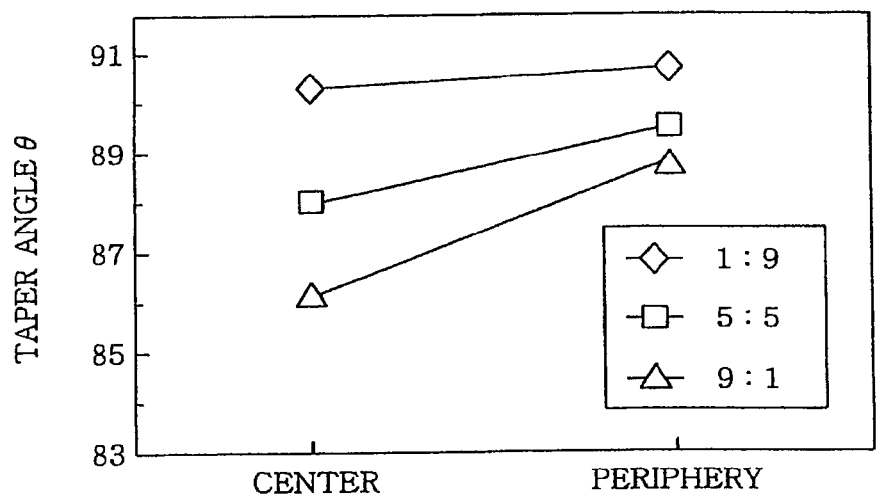

These results are shown in FIG. 11B. In FIG. 11B, the vertical axis represents the taper angle θ, while the horizontal axis represents the position on the wafer W. Further, ◇ indicates a case of the flow rate ratio C/E=1/9; □, a case of C/E=5/5; and Δ, a case of C/E=9/1. From the results, it is proved that when the flow rate ratio C/E is 1/9, the difference of the taper angle θ between the center part and the periphery part is the smallest, thus showing good in-surface uniformity of the hole shape. Therefore, it is understood that in case of the second gas having the carbon number of three or more, when a greater flow rate is supplied to the peripheral portion than to the central portion, the holes have more uniform shapes are within the surface of the wafer W.

(Embodiment 6)

After the processing gas was produced in advance by mixing $C_4F_8$ gas and $CF_4$ gas employed as the CF-based gas without the dilution gas, an etching process was performed on an etching target film (SiOCH film) formed on the wafer W under the following processing condition by introducing the processing gas into the plasma etching apparatus shown in FIG. 1 while varying the flow rates of the processing gases supplied to the central portion and the peripheral portion of the gas supply surface. Then, the in-surface uniformity of the top CD was evaluated as described above.

Figures 12, 13:
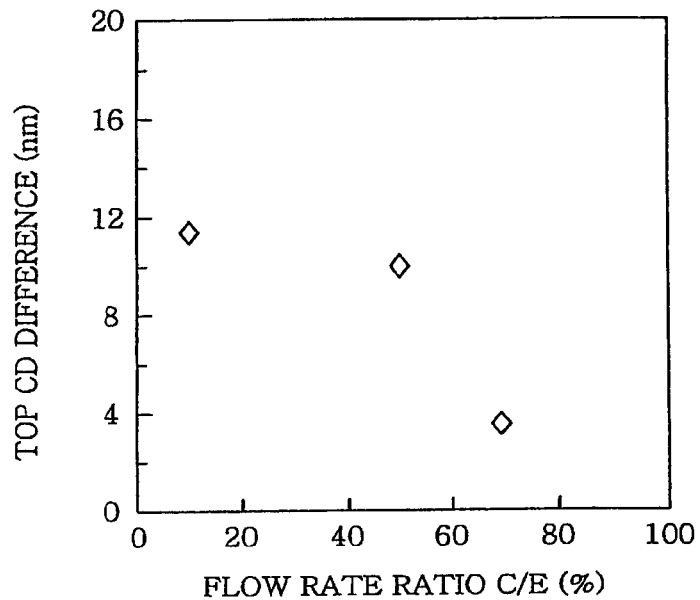
FIG. 12 is a characteristic graph showing in-surface uniformity of an absolute value of a top CD difference in Embodiment 6.
FIG. 13 shows in-surface uniformity of a top CD and a bottom CD in Embodiment 7.

<Processing Condition>
Flow rate ratio of $C_4F_8$ gas and $CF_4$ gas;
$C_4F_8$:$CF_4$=5:200 sccm
Frequency of the first high frequency power supply 61; 60 MHz
Frequency of the second high frequency power supply 65; 2 MHz Results are displayed in FIG. 12. In FIG. 12, the vertical axis represents an absolute value of difference of the top CD between the center part and the periphery part, while the horizontal axis represents the flow rate ratio C/E of processing gases supplied to the central portion and the peripheral portion. From these results, it is proved that when the flow rate ratio C/E is 7/3, the top CD difference is the smallest, showing high in-surface uniformity of the top CD.

In this embodiment, the flow rate ratio of $C_4F_8$ gas and $CF_4$ gas is 5:200 sccm. Thus, the number of fluorine atoms supplied along with the $CF_4$ gas is greater than that of fluorine atoms supplied along with the $C_4F_8$ gas. In this case, it is understood that a greater flow rate is supplied to the central portion of the gas supply surface than to the peripheral portion in accordance with the $CF_4$ gas to secure the in-surface uniformity of the top CD.

(Embodiment 7)

After a first etching process was performed by introducing the processing gas, which was produced in advance by mixing $C_4F_8$ gas and $CF_4$ gas employed as the CF-based gas; and $N_2$ gas and $O_2$ gas employed as the dilution gas, into the chamber, a second etching process was performed by introducing the processing gas, which was produced in advance by mixing $C_4F_8$ gas employed as the CF-based gas; and Ar gas and $N_2$ gas employed as the dilution gas, into the chamber. In this case, the in-surface uniformity of the top CD and the bottom CD was evaluated as described above. Further, the etching process was performed on an etching target film (laminated film formed by laminating a TEOS film having the thickness of 50 nm and bottom anti-reflection coating (BARC) having the thickness of 65 nm on a SiOCH film) formed the wafer W by using the plasma etching apparatus shown in FIG. 1 under the following processing condition while changing the flow rates of the processing gas supplied to the central portion and the peripheral portion of the gas supply surface. The evaluation was conducted for a case of the flow rate ratio C/E=5/5 in both the first and the second etching process, and a case of C/E=9/1 in the first etching process and C/E=1/9 in the second etching process.

<First Etching Processing Condition>
Flow rate ratio of $C_4F_8$ gas, $CF_4$ gas, $N_2$ gas and $O_2$ gas;
$C_4F_8$:$CF_4$:$N_2$:$O_2$=6:15:120:10 sccm
Processing pressure; 6.65 Pa (50 mTorr)
Frequency and power of the first high frequency power supply 61; 60 MHz, 800 W
Frequency and power of the second high frequency power supply 65; 2 MHz, 1400 W <Second Etching Processing Condition>
Flow rate ratio of $C_4F_8$ gas, Ar gas and $N_2$ gas;
$C_4F_8$:Ar:$N_2$=8:50:1000 sccm
Processing pressure; 3.325 Pa (25 mTorr)
Frequency and power of the first high frequency power supply 61; 60 MHz, 1000 W Frequency and power of the second high frequency power supply 65; 2 MHz, 3000 W Results are shown in FIG. 13. From these results, it is proved that when a greater amount of the processing gas is supplied to the central portion in the first etching process and to the peripheral portion in the second etching process, the difference (absolute value) between data of the top CD and the bottom CD in the center part and the periphery part of the wafer W is smaller, showing higher in-surface uniformity of the CD.

Also in case that the first etching process and then the second etching process were performed while changing kinds of the CF-based gas, as described above, it is proved that the etching process can be performed with the high in-surface uniformity by controlling the flow rates of the processing gases supplied to the central portion and the peripheral portion in accordance with the carbon number of each CF-based gas.

At this time, in the first etching process, the flow rate ratio of $C_4F_8$ gas to $CF_4$ gas is $C_4F_8:CF_4=6$ sccm:15 sccm, and thus the number of fluorine atoms supplied along with the $CF_4$ gas is greater than that of the fluorine atoms supplied along with the $C_4F_8$ gas. Therefore, it is understood that when a greater flow rate is supplied to the central portion in accordance with the $CF_4$ gas, the top CD and the bottom CD are more uniform within the surface of the wafer W. Further, in the second etching process, since $C_4F_8$ gas is used, the top CD and the bottom CD are more uniform within the surface of the wafer W when a greater flow rate is supplied to the peripheral portion.

(Embodiment 8)

Figure 14A:
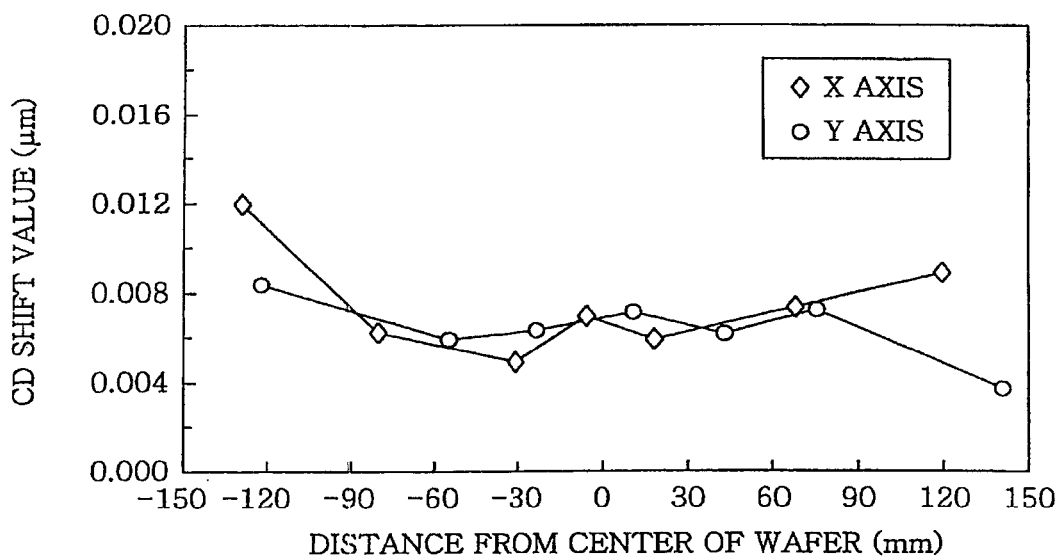
FIGS. 14A and 14B depict characteristic graphs showing in-surface uniformity of a CD shift value in Embodiment 8.
Figure 14B:
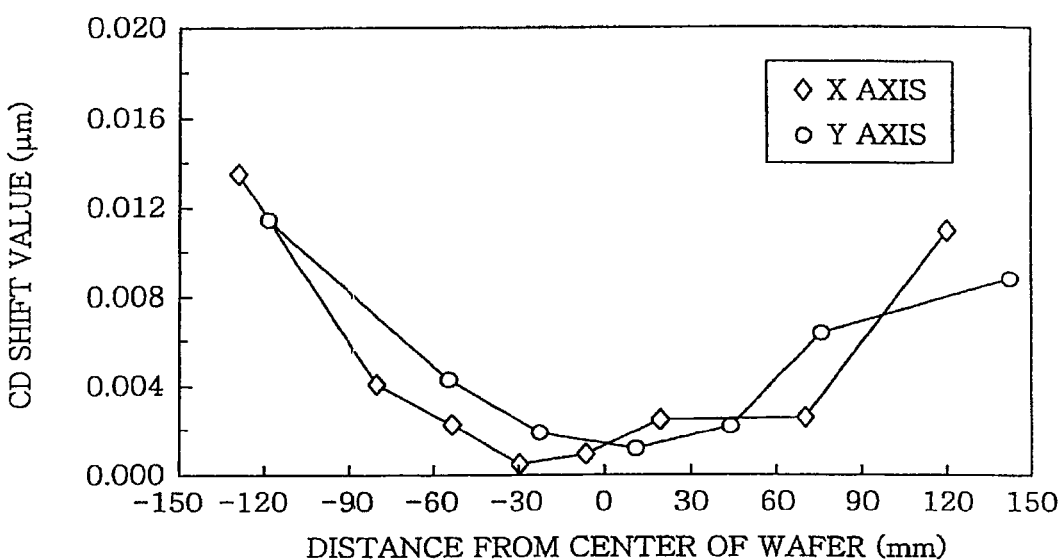

Etching processes were performed on an etching target film formed on the wafer W under the same etching condition as that in Embodiment 7, and an in-surface CD distribution was evaluated by CD-SEM (electron microscope which allows an inspection from the top surface of the wafer W without breaking the wafer W). FIG. 14A shows results obtained in case of the flow rate ratio C/E=9/1 in the first etching process and C/E=1/9 in the second etching process. FIG. 14B shows results obtained in case of the flow rate ratio C/E=5/5 in both the first and the second etching process. Further, in FIGS. 14A and 14B, the vertical axis represents a CD shift value; the horizontal axis, the position on the wafer; ◇, X-axis data; and ○, Y-axis data. The CD shift value in this embodiment means a difference of a diameter of a hole in a mask before and after etching.

From these results, it is proved that when a greater flow rate is supplied to the central portion in the first etching process and a greater flow rate is supplied to the peripheral portion in the second etching process, the CD shift values of the X-axis data and the Y-axis data are small, showing the good uniformity of the in-surface CD distribution.

(Embodiment 9)

After producing the processing gas in advance by mixing $C_5F_8$ gas employed as the CF-based gas; and Ar gas and $O_2$ gas employed as the dilution gas, the etching process was performed by introducing the processing gas into the chamber. Then, uniformity of an etching rate, resist selectivity, a residual resist film and an etching depth was evaluated. At this time, the etching process was performed on a resist formed on the wafer W under the following processing condition by using the plasma etching apparatus shown in FIG. 1, while varying the flow rates of the processing gas supplied to the central portion and the peripheral portion of the gas supply surface. The etching rate, the resist selectivity, the residual resist film and the etching depth were evaluated for a case where a flow rate supplied to the central portion was 208 sccm and a flow rate supplied to the peripheral portion was 208 sccm, and a case where a flow rate supplied to the central portion was 208 sccm and a flow rate supplied to the peripheral portion was 312 sccm. Here, the etching selectivity is calculated by a ratio of an etching amount of $SiO_2$ film to a thickness reduction amount of a resist mask film. The values of the etching rate and the resist selectivity in the center part and the periphery part of the wafer W were obtained by using a cross-sectional SEM (scanning electronic microscope) image of films after etching, and in-surface uniformity thereof was evaluated in such a manner that the smaller a difference between the values in the center part and the periphery part is, the better the in-surface uniformity gets.

<Processing Condition>

Flow rate ratio of $C_5F_8$ gas, Ar gas, and $O_2$ gas;
$C_5F_8:Ar:O_2=16:380:20$ sccm Processing pressure; 3.325 Pa (25 mTorr)

Figures 15, 16:
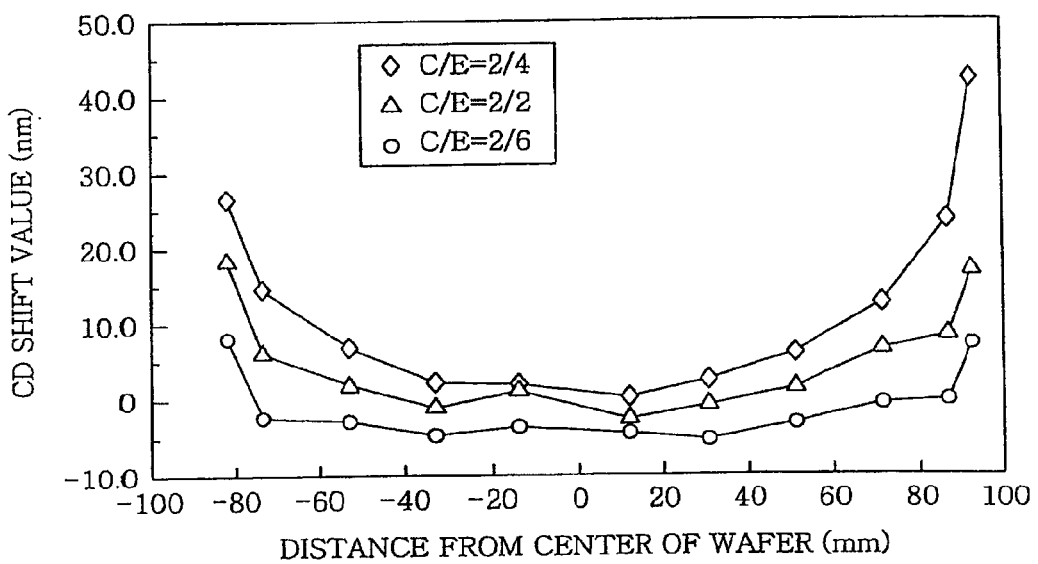
FIG. 15 shows in-surface uniformity of an etching rate, a resist selectivity, a residual resist film and an etching depth in Embodiment 9.
FIG. 16 offers a characteristic graph showing in-surface uniformity of a CD shift value in Embodiment 10.

Frequency and power of the first high frequency power supply 61; 60 MHz, 1000 W Frequency and power of the second high frequency power supply 65; 2 MHz, 3000 W Results are shown in FIG. 15. From these results, it is proved that when a greater flow rate is supplied to the peripheral central portion than to central portion of the gas supply surface, the difference of the etching rate, the etching selectivity and etching depth between the center part and the periphery part is small, showing high in-surface uniformity thereof.

Further, the flow rate supplied to the peripheral portion was changed without changing the flow rate supplied to the central portion in this embodiment, and it is confirmed that although the flow rate supplied to the peripheral portion is changed, if the flow rate supplied to the central portion is not changed, the etching characteristics in the central portion of the wafer W are not changed. Therefore, after setting the total flow rate of the processing gas and the flow rates supplied to the central portion and the peripheral portion, by increasing the flow rate supplied to the peripheral portion without any change in the flow rate supplied to the central portion, it is understood that the etching characteristics in the periphery part can be changed while maintaining the etching characteristics in the center part, thus improving the in-surface uniformity of the etching characteristics.

(Embodiment 10)

The etching process was performed by using the processing gas produced by mixing $C_4F_8$ gas employed as the CF-based gas; and CO gas, $N_2$ gas and $O_2$ gas employed as the dilution gas, and uniformity of the CD shift value was evaluated. At this time, the etching process was performed on an etching target film (SiOC film) formed on the wafer W under the following processing condition by using the plasma etching apparatus shown in FIG. 1, while varying the flow rates of the processing gas supplied to the central portion and the peripheral portion of the gas supply surface. The evaluation was made for cases where flow rate ratios C/E were 2/4, 2/2, 2/6, respectively.

<Processing Condition>

Processing pressure; 6.65 Pa (50 mTorr)

Frequency and power of the first high frequency power supply 61; 60 MHz, 800 W Frequency and power of the second high frequency power supply 65; 2 MHz, 1400 W Results are shown in FIG. 16. From these results, it is proved that the CD shift value is greatly changed in the periphery part by changing the flow rate of $C_4F_8$ gas supplied the peripheral portion, and the in-surface uniformity of the CD shift is improved by supplying a greater flow rate of $C_4F_8$ gas to the peripheral portion than to the central portion.

Therefore, it is understood that the etching process can be performed with high in-surface uniformity by changing a mixing ratio of the first gas to the second gas in the processing gas supplied to the central portion and the peripheral portion.

(Embodiment 11)

After a first etching process was performed by using the processing gas obtained by mixing $CHF_3$ gas and $CF_4$ gas employed as the CF-based gas; and Ar gas and $N_2$ gas employed as the dilution gas, a second etching process was performed by using the processing gas obtained by mixing $C_4F_8$ gas employed as the CF-based gas; and Ar gas and $N_2$ gas employed as the dilution gas. In this case, the in-surface uniformity of the top CD was evaluated as described above. At this time, the etching process was performed on a resist formed on the wafer W by introducing the processing gas, which had been mixed at a predetermined ratio, into the plasma etching apparatus shown in FIG. 1 under the following processing conditions while changing the flow rates of the processing gases supplied to the central portion and the peripheral portion.

<First Etching Processing Condition>
Flow rate ratio of $CHF_3$ gas, $CF_4$ gas, Ar gas and $N_2$ gas; $CHF_3:CF_4:Ar:N_2=15:15:500:80$ sccm
Processing pressure; 6.65 Pa (50 mTorr)
Frequency and power of the first high frequency power supply 61; 60 MHz, 800 W
Frequency and power of the second high frequency power supply 65; 2 MHz, 1700 W <Second Etching Processing Condition>
Flow rate ratio of $C_4F_8$ gas, Ar gas and $N_2$ gas; $C_4F_8:Ar:N_2=7:950:120$ sccm
Processing pressure; 6.65 Pa (50 mTorr)
Frequency and power of the first high frequency power supply 61; 60 MHz, 1200 W
Frequency and power of the second high frequency power supply 65; 2 MHz, 1700 W Further, the evaluation was conducted over a case where the flow rate ratio C/E was 50/50 in both the first etching process and the second etching process, and a case where the flow rate ratio C/E was 95/5 in the first etching process and 5/95 in the second etching process.

Figures 17, 18:
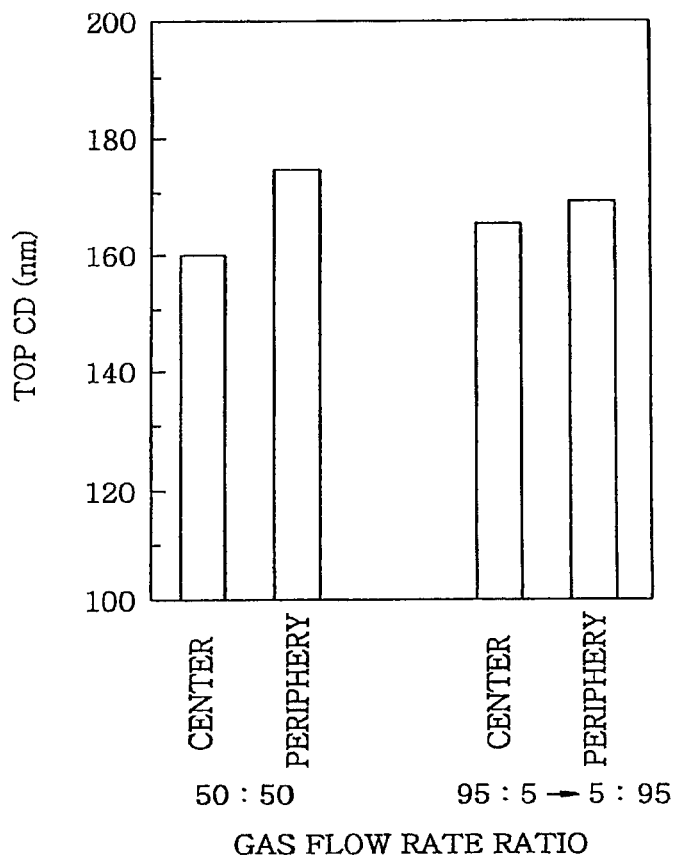
FIG. 17 is a characteristic graph showing in-surface uniformity of a CD in Embodiment 11.
FIG. 18 displays in-surface uniformity of an etching rate in Embodiment 12.

Results are shown in FIG. 17. From these results, it is proved that when a greater flow rate of the processing gas is supplied to the central portion in the first etching process and a greater flow rate of the processing gas is supplied to the peripheral portion in the second etching process, the difference of the top CD between the center part and the periphery part is small, showing the good in-surface uniformity of the CD.

As described above, it is proved that when the first etching process was performed by using the processing gas produced by mixing $CHF_3$ gas, $CF_4$ gas, Ar gas and $N_2$ gas, a greater flow rate of the processing gas is supplied to the central portion in accordance with the first gas having the carbon number of two or less, and the second etching process was performed by using the processing gas produced by mixing $C_4F_8$ gas, Ar gas and $N_2$ gas, a greater flow rate of the processing gas is supplied to the peripheral portion in accordance with the second gas having the carbon number of three or more, by supplying a greater amount of the processing gas to the peripheral portion, thus achieving the good etching characteristics.

(Embodiment 12)

The etching process was performed by using the processing gas produced in advance by mixing $C_4F_8$ gas and $CF_4$ gas employed as the CF-based gas; and $N_2$ gas and $O_2$ gas employed as the dilution gas. Then, in-surface uniformity of an etching rate was evaluated. At this time, the etching process was performed on a resist formed on the wafer W under the following processing condition by using the plasma etching apparatus shown in FIG. 1, while varying the flow rates of the processing gas supplied to the central portion and the peripheral portion of the gas supply surface.

<Processing Condition>
Flow rate ratio of $C_4F_8$ gas, $CF_4$ gas, $N_2$ gas and $O_2$ gas; $C_4F_8:CF_4:N_2:O_2=6:15:120:10$ sccm
Processing pressure; 6.65 Pa (50 mTorr)
Frequency and power of the first high frequency power supply 61; 60 MHz, 800 W
Frequency and power of the second high frequency power supply 65; 2 MHz, 1400 W Further, the evaluation was conducted for a case of the flow rate ratio C/E=5/5, and a case of C/E=9/1.

Results are shown in FIG. 18. From these results, it is proved that when a greater flow rate of the processing gas is supplied to the central portion, the difference of the etching rate between the center part and the periphery part is small, showing the high in-surface uniformity of the etching rate.

Further, in case of supplying a gaseous mixture of the first gas and the second gas, it is proved that when the number of fluorine atoms supplied along with $CF_4$ gas is greater than that of fluorine atoms supplied along with $C_4F_8$, flow rates of the processing gases supplied the central portion and the peripheral portion are controlled in accordance with the $CF_4$ gas to thereby obtain the good etching characteristics.

The present invention may be applied to a glass substrate employed in a flat display panel, such as an LCD and a PDP glass substrate, as well as the semiconductor wafer W. Further, the plasma etching apparatus used in the present invention may be of an RIE (reactive ion etching) type, an ICP (inductive coupled plasma) type, an ECR (electron cyclotron resonance) type, a helicon wave plasma type or the like, all using magnetic field, instead of a parallel plate type plasma etching apparatus.

While the invention has been shown and described with respect to the preferred embodiments, it will be understood by those skilled in the art that various changes and modifications may be made without departing from the spirit and scope of the invention as defined in the following claims.

The invention claimed is:

1. An etching apparatus for performing etching of an etching target film of a substrate by using processing gases that include a first processing gas and a second processing gas, the etching apparatus comprising:
a processing chamber in which a susceptor for mounting the substrate thereon is disposed;
at least one first gas supply source containing a first gas that includes at least one of a $CH_2F_2$ gas, a $CHF_3$ gas, $CF_4$ gas or a $C_2F_6$ gas;
at least one second gas supply source containing a second gas that includes at least one of a $C_3F_8$ gas, a $C_4F_8$ gas, a $C_4F_6$ gas, or a $C_5F_8$ gas;
at least one mixing arrangement which mixes the gas and the second gas to form the first processing gas and the second processing gas, wherein each of the first processing gas and the second processing gas is a gaseous mixture of the first gas and the second gas;
a gas supply unit, disposed in the processing chamber to face the susceptor, for simultaneously supplying the first processing gas and the second processing gas, the gas supply unit having a gas supply surface facing the susceptor;

a first gas introduction line connected to a central portion of the gas supply unit for supplying the first processing gas to the central portion of the gas supply unit;

a second gas introduction line connected to a peripheral portion of the gas supply unit for supplying the second processing gas to the peripheral portion of the gas supply unit;

a first flow rate control unit disposed at the first gas introduction line;

a second flow rate control unit disposed at the second gas introduction line; and a controller for controlling the supply of the first processing gas and the second processing gas, wherein the gas supply unit comprises a first gas introduction chamber for supplying the first processing gas to a central part of the substrate and a second gas introduction chamber for supplying the second processing gas to a peripheral part of the substrate, wherein the controller is programmed to control the supplying of the first processing gas and the second processing gas such that a flow rate of the first gas from the gas supply unit per unit area of the gas supply surface of the gas supply unit is greater in the central portion than in the peripheral portion and, simultaneously, a flow rate of the second gas from the gas supply unit per unit area of the gas supply surface of the gas supply unit is greater in the peripheral portion than in the central portion.

2. The etching apparatus of claim 1, wherein the first processing gas and the second processing gas comprise a dilution gas and wherein at least one of a dilution rate of the first gas and a dilution rate of the second gas is controlled by the dilution gas.

3. The etching apparatus of claim 1, wherein the at least one gas mixing arrangement comprises:

a first gas mixing arrangement that is configured to control a mixing ratio of the first gas to the second gas to form the first processing gas; and a second gas mixing arrangement that is configured to control a mixing ratio of the first gas to the second gas to form the second processing gas, wherein the controller controls the first gas mixing arrangement and the second gas mixing arrangement such that the mixing ratio of the first gas to the second gas in the first processing gas is different than the mixing ratio of the first gas to the second gas in the second processing gas; and wherein the first gas introduction line connects an outlet of the first gas mixing arrangement to an inlet of the central portion of the gas supply unit, and wherein the second gas introduction line connects an outlet of the second gas mixing arrangement to an inlet of the peripheral portion gas supply unit, wherein the first flow rate control unit controls a flow rate of the first processing gas downstream of the first gas mixing arrangement, wherein the second flow rate control unit controls a flow rate of the second processing gas downstream of the second gas mixing arrangement.

4. The etching apparatus of claim 3, wherein the first gas mixing arrangement comprises a third flow rate control unit and a fourth flow rate control unit, wherein the third flow rate control unit is connected to the at least one first gas supply source, and wherein the fourth flow rate control unit is connected to the at least one second gas supply source.

5. The etching apparatus of claim 3, wherein the at least one first gas supply source includes one first gas supply source and another first gas supply source;

wherein the at least one second gas supply source includes one second gas supply source and another second gas supply source;

wherein the first gas mixing arrangement is configured to mix gas from said one first gas supply source and said one second gas supply source and includes a third flow rate control unit connected to said one first gas supply source and a fourth flow rate control unit connected to said one second gas supply source; and wherein the second gas mixing arrangement is configured to mix gas from said another first gas supply source and said another second gas supply source and includes a fifth flow rate control unit connected to said another first gas supply source and a sixth flow rate control unit connected to said another second gas supply source.

6. An etching apparatus for performing etching of an etching target film of a substrate by using processing gases that include a first processing gas and a second processing gas, the etching apparatus comprising:

a processing chamber in which a susceptor for mounting the substrate thereon is disposed;

at least one first gas supply source containing a first gas that includes a halogen and carbon having a carbon number of two or less per molecule;

at least one second gas supply source containing a second gas that includes a halogen and carbon having a carbon number of three or more per molecule;

a gas supply unit, disposed in the processing chamber to face the susceptor, for simultaneously supplying the first processing gas and the second processing gas, the gas supply unit having a gas supply surface facing the susceptor;

a controller;

a first gas mixing arrangement that mixes the first gas and the second gas to form the first processing gas, wherein the controller controls the first gas mixing arrangement to control a mixing ratio of the first gas to the second gas in the first processing gas;

a second gas mixing arrangement that mixes the first gas and the second gas to form the second processing gas, wherein the controller controls the second gas mixing arrangement to control a mixing ratio of the first gas to the second gas in the second processing gas, and wherein the mixing ratio of the first gas to the second gas in the first processing gas is different than the mixing ratio of the first gas to the second gas in the second processing gas;

a first gas introduction line connecting an outlet of the first gas mixing arrangement to an inlet of a central portion of the gas supply unit for supplying the first processing gas to the central portion of the gas supply unit;

a second gas introduction line connecting an outlet of the second gas mixing arrangement to an inlet of a peripheral portion of the gas supply unit for supplying the second processing gas to the peripheral portion of the gas supply unit;

a first downstream flow rate control unit disposed at the first gas introduction line and configured to control a flow rate of the first processing gas downstream of the first gas mixing arrangement;

a second downstream flow rate control unit disposed at the second gas introduction line and configured to control a flow rate of the second processing gas downstream of the second gas mixing arrangement, wherein the gas supply unit comprises a first gas introduction chamber for supplying the first processing gas to a central part of the substrate and a second gas introduction chamber for supplying the second processing gas to a peripheral part of the substrate, wherein the controller is programmed to control the first gas mixing arrangement, the second gas mixing arrangement, the first downstream flow rate control unit, and the second downstream flow rate control unit such that a flow rate of the first gas per unit area of the gas supply surface of the gas supply unit is greater in the central portion than in the peripheral portion and, simultaneously, a flow rate of the second gas per unit area of the gas supply surface of the gas supply unit is greater in the peripheral portion than in the central portion.

7. The etching apparatus of claim 6, wherein the first set of one or more gas supply sources contain at least one of a $CH_2F_2$ gas, a $CHF_3$ gas, a $CF_4$ gas or a $C_2F_6$ gas.

8. The etching apparatus of claim 7, wherein the second set of one or more gas supply sources contain at least one of a $C_3F_8$ gas, a $C_4F_8$ gas, a $C_4F_6$ gas, or a $C_5F_8$ gas.

9. The etching apparatus of claim 8,
wherein the at least one first gas supply source includes one first gas supply source and another first gas supply source;

wherein the at least one second gas supply source includes one second gas supply source and another second gas supply source;

wherein the first mixing arrangement is configured to mix gas from said one first gas supply source and said one second gas supply source and includes a third flow rate control unit connected to said one first gas supply source and a fourth flow rate control unit connected to said one second gas supply source; and wherein the second gas mixing arrangement is configured to mix gas from said another first gas supply source and said another second gas supply source and includes a fifth flow rate control unit connected to said another first gas supply source and a sixth flow rate control unit connected to said another second gas supply source.

10. The etching apparatus of claim 6,
wherein the at least one first gas supply source includes one first gas supply source and another first gas supply source;

wherein the at least one second gas supply source includes one second gas supply source and another second gas supply source;

wherein the first mixing arrangement is configured to mix gas from said one first gas supply source and said one second gas supply source and includes a third flow rate control unit connected to said one first gas supply source and a fourth flow rate control unit connected to said one second gas supply source; and wherein the second gas mixing arrangement is configured to mix gas from said another first gas supply source and said another second gas supply source and includes a fifth flow rate control unit connected to said another first gas supply source and a sixth flow rate control unit connected to said another second gas supply source.

* * * * *